(12) United States Patent
Lee et al.

(10) Patent No.: US 9,299,707 B2
(45) Date of Patent: Mar. 29, 2016

(54) THREE-DIMENSIONAL SEMICONDUCTOR DEVICES WITH CURRENT PATH SELECTION STRUCTURE

(71) Applicants: Jaeduk Lee, Seongnam-si (KR); Youngwoo Park, Seoul (KR); Jintaek Park, Hwasung-si (KR); Dohyun Lee, Hwasung-si (KR); Kohji Kanamori, Seoul (KR)

(72) Inventors: Jaeduk Lee, Seongnam-si (KR); Youngwoo Park, Seoul (KR); Jintaek Park, Hwasung-si (KR); Dohyun Lee, Hwasung-si (KR); Kohji Kanamori, Seoul (KR)

(73) Assignee: Samsung Electronics Co., Ltd. (KR)

( * ) Notice: Subject to any disclaimer, the term of this patent is extended or adjusted under 35 U.S.C. 154(b) by 68 days.

(21) Appl. No.: 14/150,452

(22) Filed: Jan. 8, 2014

(65) Prior Publication Data

US 2014/0197469 A1 Jul. 17, 2014

(30) Foreign Application Priority Data

Jan. 11, 2013 (KR) ......................... 10-2013-0003278

(51) Int. Cl.
| | |
|---|---|
| *H01L 27/108* | (2006.01) |
| *H01L 27/105* | (2006.01) |
| *H01L 27/115* | (2006.01) |
| *G11C 16/10* | (2006.01) |
| *G11C 16/14* | (2006.01) |

(52) U.S. Cl.
CPC ............ *H01L 27/1052* (2013.01); *G11C 16/10* (2013.01); *G11C 16/14* (2013.01); *H01L 27/11524* (2013.01); *H01L 27/11556* (2013.01)

(58) Field of Classification Search
CPC ..................... H01L 27/1052; H01L 27/11524; H01L 27/11556
USPC ............................................... 257/68, 71, 296
See application file for complete search history.

(56) References Cited

U.S. PATENT DOCUMENTS

| | | | |
|---|---|---|---|
| 8,159,017 | B2 | 4/2012 | Seol et al. |
| 8,208,279 | B2 | 6/2012 | Lue |
| 8,335,109 | B2 | 12/2012 | Seol et al. |
| 8,385,122 | B2 | 2/2013 | Kim et al. |
| 2008/0237602 | A1* | 10/2008 | Mokhlesi et al. ............... 257/67 |

(Continued)

FOREIGN PATENT DOCUMENTS

KR 10-1112431 B1 2/2012

OTHER PUBLICATIONS

Hung et al., "A Highly Scalable Vertical Gate (VG) 3D NAND Flash with Robust Program Disturb Immunity Using a Novel PN Diode Decoding Structure", *2011 Symposium on VLSI Technology Digest of Technical Papers*, Jun. 14-16, 2011, pp. 68-69.

(Continued)

*Primary Examiner* — Thanh T Nguyen
(74) *Attorney, Agent, or Firm* — Myers Bigel & Sibley, P.A.

(57) ABSTRACT

Provided are three-dimensional semiconductor devices and methods of operating the same. The three-dimensional semiconductor devices may include active patterns arranged on a substrate to have a multi-layered and multi-column structure and drain patterns connected to respective columns of the active patterns. The methods may include a layer-selection step connecting a selected one of layers of the active patterns selectively to the drain patterns. For example, the layer-selection step may be performed in such a way that widths of depletion regions to be formed in end-portions of the active patterns are differently controlled depending on to a height from the substrate.

26 Claims, 33 Drawing Sheets

(56) References Cited

U.S. PATENT DOCUMENTS

| | | |
|---|---|---|
| 2011/0169067 A1 | 7/2011 | Ernst et al. |
| 2011/0266607 A1 | 11/2011 | Sim et al. |
| 2012/0182804 A1* | 7/2012 | Hung et al. ............. 365/185.13 |
| 2012/0327714 A1* | 12/2012 | Lue .......................... 365/185.17 |

OTHER PUBLICATIONS

Kim et al., "Multi-Layered Vertical Gate NAND Flash Overcoming Stacking Limit for Terabit Density Storage", *2009 Symposium on VLSI Technology Digest of Technical Papers*, Jun. 16-18, 2009, pp. 188-189.

* cited by examiner

[Vertical Section]

Horizontal Section
[Level 1]

Horizontal Section
[Level 1]

THREE-DIMENSIONAL SEMICONDUCTOR DEVICES WITH CURRENT PATH SELECTION STRUCTURE

CROSS-REFERENCE TO RELATED APPLICATION

This U.S. non-provisional patent application claims priority under 35 U.S.C. §119 to Korean Patent Application No. 10-2013-0003278, filed on Jan. 11, 2013, the entirety of which is hereby incorporated herein by reference.

BACKGROUND

Example embodiments of the inventive concepts relate to semiconductor devices, and in particular, to three-dimensional semiconductor devices and methods of operating the same.

In semiconductor devices, increased integration can provide high performance, low cost devices. In a two-dimensional semiconductor memory device or in a planar semiconductor memory device, integration is largely affected by a technique of forming a fine pattern, since integration is mainly determined by an area that a unit memory cell occupies. However, since equipment that is required to form a fine pattern may be very expensive, economically increasing integration of a two-dimensional memory semiconductor device may be limited.

To overcome such a limitation, three-dimensional memory devices (that is, including three-dimensionally arranged memory cells) are being developed. Not only the memory cells but also interconnection lines (e.g., word lines or bit lines) are three-dimensionally arranged in the three-dimensional memory devices.

SUMMARY

Example embodiments of the inventive concepts can provide three-dimensional semiconductor devices, in which a string selection structure for selective connections between active patterns and bit lines is provided.

Other example embodiments of the inventive concepts can provide methods of operating a three-dimensional semiconductor device, in which a string selection structure for selective connections between active patterns and bit lines is provided.

Still other example embodiments of the inventive concepts can provide three-dimensional semiconductor devices including a common source structure provided to realize electric connections between active patterns and a common source electrode.

Yet other example embodiments of the inventive concepts can provide methods of operating a three-dimensional semiconductor device including a common source structure provided to realize electric connections between active patterns and a common source electrode.

According to example embodiments of the inventive concepts, a three-dimensional semiconductor memory device may include a common source structure, a string selection structure, and a memory structure provided on a substrate, the memory structure interposed between the common source structure and the string selection structure. The memory structure may include a plurality of active patterns elongated parallel to a top surface of the substrate, gate patterns provided perpendicular to the top surface of the substrate, and Memory elements interposed between the active patterns and the gate patterns, and the string selection structure may include drain patterns elongated perpendicular to the top surface of the substrate to connect end-portions of the active patterns to each other and layer-selection patterns sequentially stacked to control an energy band structure of the end-portions of the active patterns located at the same level.

In other embodiments, the string selection structure is configured to select a plurality of the memory elements at a given level relative to the top surface of the substrate, while simultaneously refraining from selecting other memory elements that overlie or underlie the plurality of memory elements at the given level.

In example embodiments, the drain patterns include a semiconductor material being in direct contact with the active patterns and having the same conductivity type as the active patterns.

In example embodiments, the drain patterns may be formed of an n- or p-type highly-doped semiconductor material, and the active patterns may be formed of a lightly-doped semiconductor material having the same conductivity type as the drain patterns.

In example embodiments, the layer-selection patterns include a semiconductor material being in direct contact with the active patterns and having a different conductivity type from the active patterns.

In example embodiments, the drain patterns may include a semiconductor material being in direct contact with the active patterns having a different conductivity type from the active patterns, and the drain patterns have an impurity concentration higher than the active patterns.

In example embodiments, the string selection structure may further include a string selection insulating layer electrically separating the active patterns from the layer-selection patterns.

In example embodiments, each of the layer-selection patterns and end-portions of the active patterns located adjacent thereto may be configured to be able to be operated as metal-oxide-semiconductor (MOS) capacitors.

In example embodiments, the active patterns may be arranged in horizontal and vertical directions to have a multi-layered and multi-column structure, and each of the drain patterns may be provided between a corresponding pair of columns of the active patterns.

In example embodiments, each of the drain patterns may be connected in common to a plurality of the active patterns that constitute a corresponding one of the columns and are arranged at different levels from each other.

In example embodiments, each of the layer-selection patterns may be connected in common to a plurality of the active patterns that constitute a corresponding one of the layers and are arranged at different columns from each other.

In example embodiments, each of the drain patterns may include at least one of metal materials, metal silicide materials, or semiconductor materials, and each of the drain patterns may be configured in such a way that a portion adjacent to the active patterns has the same energy band structure as end-portions of the active patterns.

In example embodiments, each of the layer-selection patterns may include at least one of metal materials, metal silicide materials, or semiconductor materials.

In example embodiments, the active patterns include at least one of metal materials, metal silicide materials, n-type semiconductor materials, p-type semiconductor materials, or intrinsic semiconductor materials.

In example embodiments, the layer-selection patterns may be electrically separated from each other, and the drain patterns may be electrically separated from each other.

According to example embodiments of the inventive concepts, a three-dimensional semiconductor memory device may include first and second active patterns constituting a first layer, third and fourth active patterns constituting a second layer, a first drain pattern connected to the first and third active patterns, a second drain pattern connected to the second and fourth active patterns, a first layer-selection pattern provided near the first and second active patterns and configured to control depths of depletion regions to be formed therein, and a second layer-selection pattern provided near the third and fourth active patterns and configured to control depths of depletion regions to be formed therein.

In example embodiments, the first drain patterns include a semiconductor material being in direct contact with the first and third active patterns and having the same conductivity type as the first and third active patterns, and the second drain patterns may include a semiconductor material being in direct contact with the second and fourth active patterns and having the same conductivity type as the second and fourth active patterns.

In example embodiments, the first and second drain patterns may be formed of an n- or p-type semiconductor material, and the first to fourth active patterns include a semiconductor material having the same conductivity type as the first and second drain patterns.

In example embodiments, the first layer-selection pattern may include a semiconductor material being in direct contact with the first and second active patterns and having a different conductivity type from the first and second active patterns.

In example embodiments, the first drain patterns include a semiconductor material being in direct contact with the first and third active patterns and having the same conductivity type as the first and third active patterns, the second drain patterns include a semiconductor material being in direct contact with the second and fourth active patterns and having the same conductivity type as the second and fourth active patterns, and each of the first and second drain patterns have an impurity concentration higher than the first to fourth active patterns.

In example embodiments, the device may further include an insulating layer interposed between the first and second active patterns and the first layer-selection patterns and between the third and fourth active patterns and the second layer-selection patterns.

According to example embodiments of the inventive concepts, a three-dimensional semiconductor memory device may include an active structure including active patterns that may be arranged in horizontal and vertical directions on a substrate, a first common source electrode connected in common to end-portions of the active patterns, and a second common source electrode connected in common to the end-portions of the active patterns. The first and second common source electrodes may include semiconductor materials having different conductivity types from each other.

In example embodiments, the active patterns include an intrinsic semiconductor material or a semiconductor material of a first conductivity type, the first common source electrode may include a semiconductor material of a second conductivity type, and the second common source electrode may include a semiconductor material of the first conductivity type. One of the first and second conductivity types may be an n-type and the other may be a p-type.

In example embodiments, the active patterns include an intrinsic semiconductor material or a semiconductor material of a first conductivity type, the first common source electrode may include a semiconductor material of the first conductivity type, and the second common source electrode may include a semiconductor material of a second conductivity type. One of the first and second conductivity types may be an n-type and the other may be a p-type.

In example embodiments, each of the active patterns may include an outer sidewall defining an outer boundary of the active structure, and inner sidewalls positioned in the active structure to face others of the active patterns adjacent thereto. The first common source electrode may be connected to the inner sidewalls of the active patterns, and the second common source electrode may be connected to the outer sidewalls of the active patterns.

In example embodiments, the first common source electrode may include a plurality of source plugs elongated along a vertical direction and interposed between the active patterns, and the second common source electrode may be connected in common to the active patterns arranged along horizontal and vertical directions.

In example embodiments, the source plugs may be in direct contact with the second common source electrode.

In example embodiments, the source plugs may be spaced apart from the second common source electrode.

In example embodiments, each of the source plugs may include a pair of junction portions covering two columns, respectively, of the active patterns arranged adjacent thereto and a connecting portion facing the second common source electrode and connecting the junction portions, thereby having 'U'-shaped horizontal section.

In example embodiments, a horizontal space between the source plugs may be smaller than a horizontal width of each of the active patterns.

In example embodiments, each of the source plugs may be connected in common to two columns of the active patterns arranged adjacent thereto.

In example embodiments, each of the source plugs may be connected to one of two columns of the active patterns that may be arranged adjacent thereto.

In example embodiments, the second common source electrode may include a plate electrode disposed at a side of the active structure, and at least one contact electrode interposed between the plate electrode and the active structure. The plate electrode may be formed of a material, whose resistivity may be lower than the at least one contact electrode.

In example embodiments, the at least one contact electrode may include a plurality of contact electrodes that may be one-dimensional or two-dimensionally arranged on a sidewall of the plate electrode.

According to example embodiments of the inventive concepts, provided is a method of operating a three-dimensional semiconductor device including active patterns arranged on a substrate to have a multi-layered and multi-column structure and drain patterns connected to respective columns of the active patterns. The method may include a layer-selection step connecting a selected one of layers of the active patterns selectively to the drain patterns. The layer-selection step may be performed in such a way that widths of depletion regions to be formed in end-portions of the active patterns are differently controlled depending on to a height from the substrate.

In example embodiments, the three-dimensional semiconductor device may further include layer-selection patterns that may be sequentially stacked on the substrate and may be connected to respective layers of the active patterns, the layer-selection step may include applying a first voltage to one of the layer-selection patterns connected to the selected layer and a second voltage to the others of the layer-selection patterns, the first voltage may be selected in such a way that boundaries of the depletion regions formed thereby may be spaced apart from the drain patterns, and the second voltage may be selected in such a way that boundaries of the depletion regions formed thereby may be in contact with the drain patterns.

In example embodiments, the layer-selection patterns and the active patterns may be configured to be operated as reverse-bias diodes.

In example embodiments, the layer-selection patterns and the active patterns may be configured to be operated as metal-oxide-semiconductor (MOS) capacitors.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
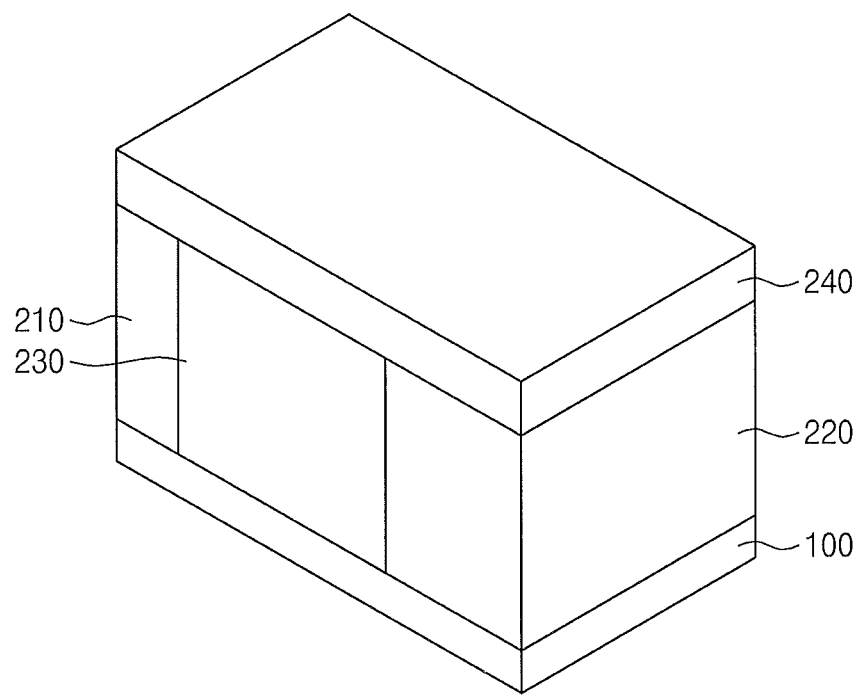
FIG. 1 is a perspective view schematically illustrating a portion of a cell array region of a three-dimensional semiconductor device according to example embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concepts of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of this specification and the relevant art and will not be interpreted in an idealized or overly formal sense unless expressly so defined herein.

FIG. 1 is a perspective view schematically illustrating a portion of a cell array region of a three-dimensional semiconductor device according to example embodiments of the inventive concepts.

Referring to FIG. 1, a three-dimensional semiconductor device may include a common source structure 210, a string selection structure 220, a memory structure 230, and a wiring structure 240 that are provided on a substrate 100. The memory structure 230 may be interposed between the common source structure 210 and the string selection structure 220, and the wiring structure 240 may be provided on the string selection structure 220. In example embodiments, the wiring structure 240 may extend over the memory structure 230 and/or the common source structure 210.

The memory structure 230 may include memory cells arranged three-dimensionally on the substrate 100. Furthermore, the memory structure 230 may include conductive lines electrically connecting the memory cells to each other and insulating patterns electrically separating semiconductor patterns and the memory cells from each other. The memory structure 230 will be described in more detail with reference to FIGS. 2 and 3.

The common source structure 210 and the string selection structure 220 may be configured to control selectively electric paths to the memory cells. For example, the string selection structure 220 may be configured to realize a selective connection between the wiring structure 240 and the memory structure 230. The common source structure 210 will be described in more detail with reference to FIGS. 4 through 12, and the string selection structure 220 will be described in more detail with reference to FIGS. 13 through 26.

Figure 2:
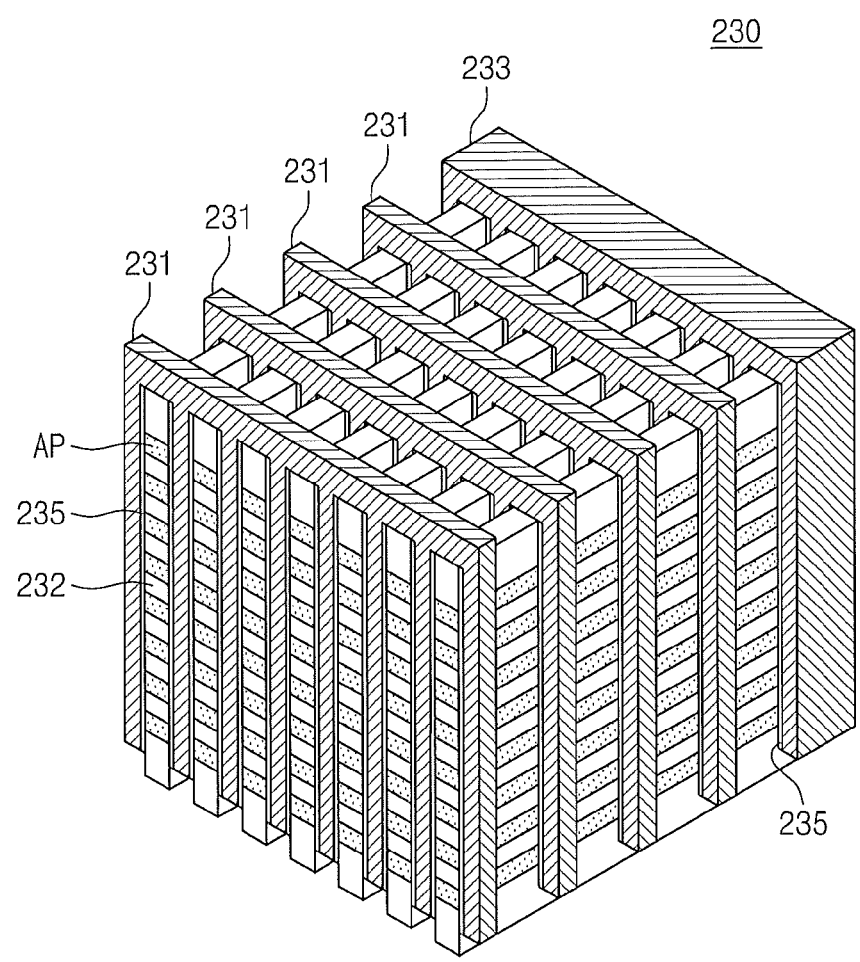
FIG. 2 is a perspective view illustrating a memory structure according to example embodiments of the inventive concepts.
Figure 3:
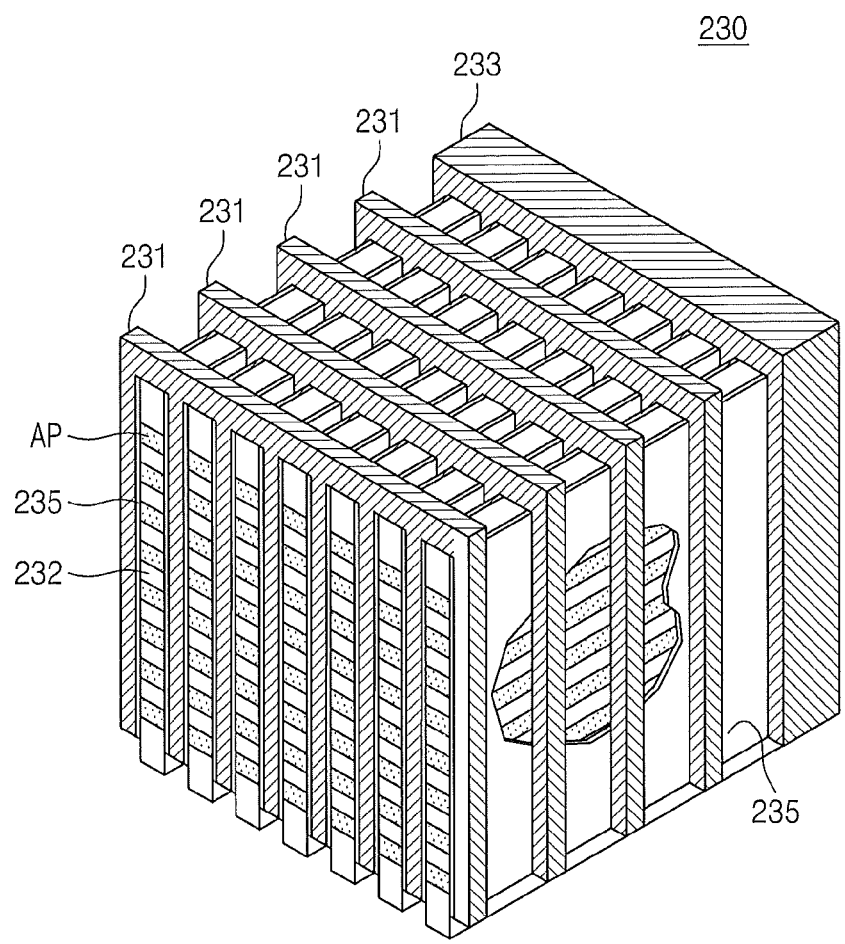
FIG. 3 is a perspective view illustrating a memory structure according to other example embodiments of the inventive concepts.

FIG. 2 is a perspective view illustrating a memory structure according to example embodiments of the inventive concepts, and FIG. 3 is a perspective view illustrating a memory structure according to other example embodiments of the inventive concepts.

Referring to FIGS. 2 and 3, the memory structure 230 may include a plurality of active patterns AP that are arranged to have a multi-level and multi-column structure. Each of the active patterns AP may be elongated to be parallel to the top surface of the substrate 100. For example, each of the active patterns AP may be a line-shaped pattern extending from the common source structure 210 to the string selection structure 220.

The active patterns AP may be provided at a plurality of levels to form the multi-level structure as described above. Furthermore, on each level, the active patterns AP may be horizontally spaced apart from each other to form a plurality of columns.

In example embodiments, the active patterns AP may be formed of a semiconductor material. For example, the active patterns AP may include an intrinsic or doped silicon material. But example embodiments of the inventive concepts may not be limited thereto. For example, the active patterns AP may include at least one of metal materials, metal silicide materials, n-type semiconductor materials, p-type semiconductor materials, or intrinsic semiconductor materials.

The memory structure 230 may further include a plurality of gate patterns that are provided to face sidewalls of the active patterns AP. The gate patterns may be arranged to be spaced apart from each other in a longitudinal direction of the active pattern AP. For example, the gate patterns may include at least one ground selection pattern 233 disposed adjacent to the common source structure 210 and a plurality of word lines 231 that are spaced apart from the ground selection pattern 233 and the string selection structure 220. In example embodiments, the gate patterns may further include at least one string selection pattern (not shown) disposed adjacent to the string selection structure 220.

Each of the gate patterns may include a plurality of electrode portions elongated perpendicular to the top surface of the substrate 100 and a connecting portion provided on the active patterns AP to connect the electrode portions to each other. Each of the electrode portions may be inserted between a corresponding pair of the columns of the active patterns AP to face the sidewalls of the active patterns AP. In other words, each of the gate patterns may be shaped like a comb.

The memory structure 230 may further include interlayered dielectric patterns 232 and memory patterns 235. The interlayered dielectric patterns 232 may be arranged to have a multi-level and multi-column structure, similar to the active patterns AP, and they may be formed of an insulating material (e.g., silicon oxide, silicon nitride, or silicon oxynitride).

As shown in FIG. 2, the memory patterns 235 may be interposed between sidewalls of the word lines 231 and the active patterns AP. In example embodiments, the memory patterns 235 may be provided to have a multi-layered charge-storable structure. For example, each of the memory patterns 235 may be a multi-layered structure including a silicon nitride layer and at least one insulating layer, whose bandgap is greater than that of the silicon nitride layer. Each of the memory patterns 235 may be vertically elongated to cover sidewalls of the interlayered dielectric patterns 232. Furthermore, as shown in FIG. 3, each of the memory patterns 235 may extend horizontally to be connected to each other. In certain embodiments, each of the memory patterns 235 may extend over the active patterns AP and be connected to another adjacent thereto.

FIGS. 4 through 10 are perspective views illustrating common source structures, according to example embodiments of the inventive concepts.

The common source structure 210 may include a first common source electrode 211 and a second common source electrode 215. The first and second common source electrodes 211 and 215 may include materials, whose Fermi levels are different from each other. For example, one of the first and second common source electrodes 211 and 215 may include a semiconductor material with the same conductivity type as the active patterns AP, and the other may include a semiconductor material with a different conductivity type from the active patterns AP. In example embodiments, the first and second common source electrodes 211 and 215 may be formed of the same semiconductor material (e.g., of silicon) or of semiconductor materials different from each other. In other embodiments, one of the first and second common source electrodes 211 and 215 may include a semiconductor material with a different conductivity type from the active patterns AP, and the other may include a conductive material (e.g., at least one of metals, metal silicides, or metal nitrides) capable of providing an ohmic contact property with respect to the active patterns AP.

In example embodiments, both of the first and second common source electrodes 211 and 215 may be substantially connected to the active patterns AP. In other words, each of the active patterns AP may include at least two different portions that are in direct contact with the first common source electrode 211 and the second common source electrode 215, respectively. To make such a direct contact, the first and second common source electrodes 211 and 215 may be variously modified in terms of shape and arrangement.

For example, as shown in FIGS. 4 through 10, the second common source electrode 215 may be formed to cover outer sidewalls of the active patterns AP, while the first common source electrode 211 may be formed to cover inner sidewalls of the active patterns AP. Here, the outer sidewalls may refer to side surfaces of the active patterns AP facing the common source structure 210, and the inner sidewalls may refer to opposite side surfaces of the active patterns AP arranged adjacent to each other. For example, if all of the active patterns AP is referred to as an active structure, the outer sidewalls of the active patterns AP may define an outer boundary of the active structure, and the inner sidewalls of the active patterns AP may be sidewalls, which are located within the active structure, of the active patterns.

Figure 4:
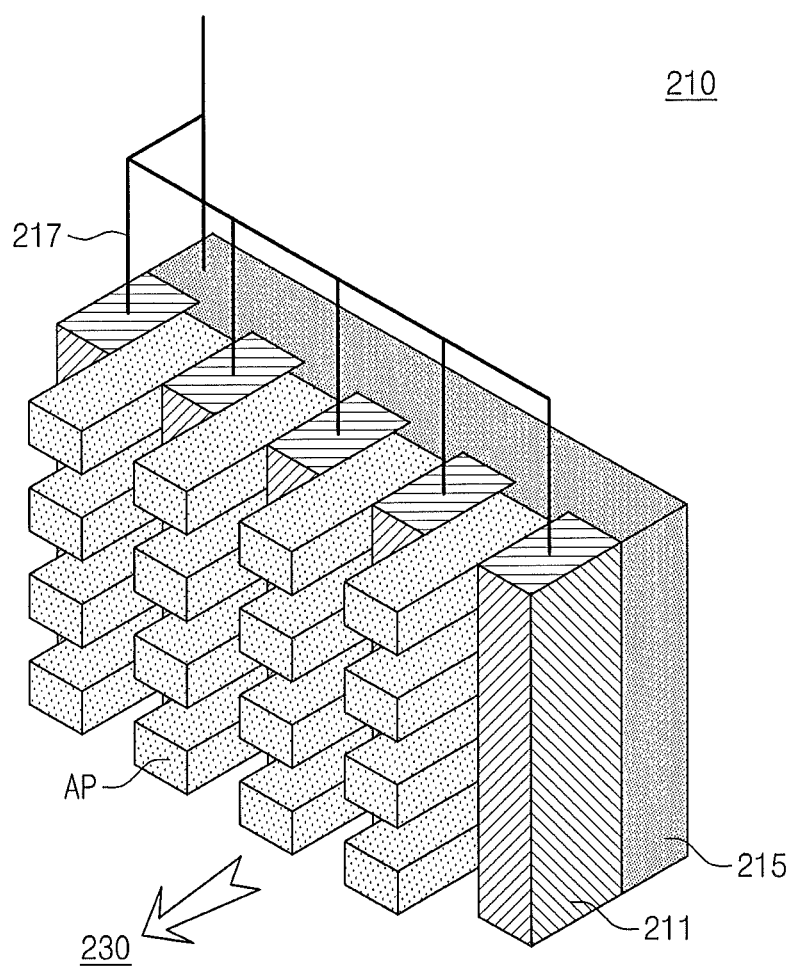
FIGS. 4 through 10 are perspective views illustrating common source structures, according to example embodiments of the inventive concepts.
Figure 5:
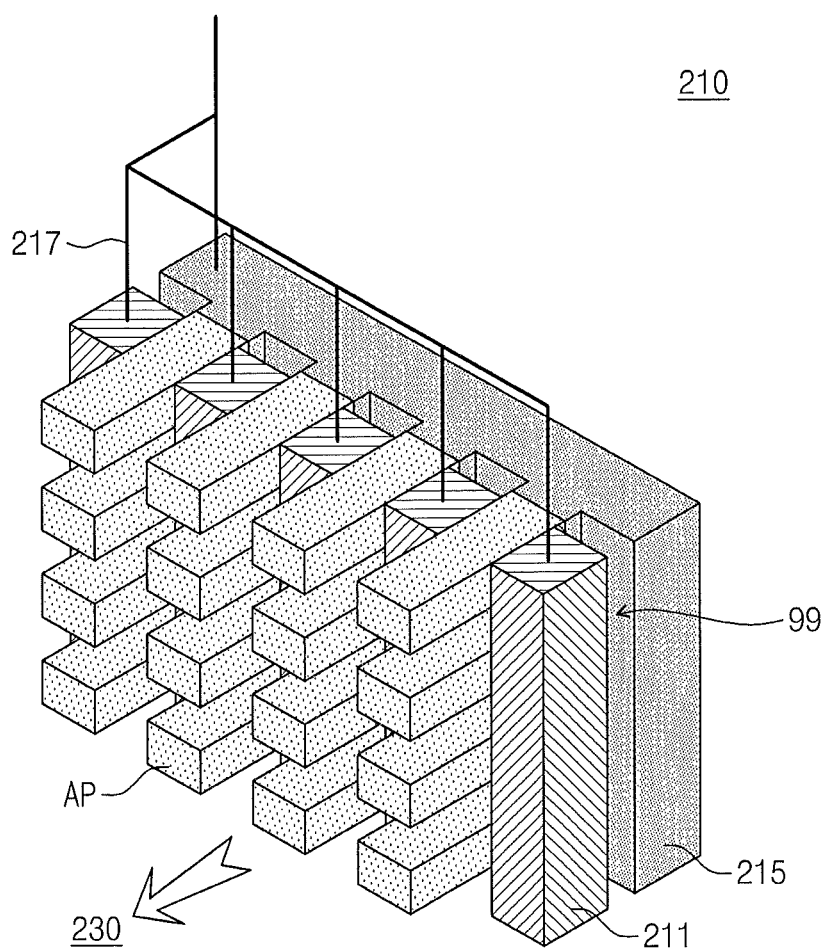

In example embodiments, as shown in FIG. 4, the first common source electrode 211 may be in direct contact with the second common source electrode 215. In other embodiments, as shown in FIG. 5, the first common source electrode 211 may be formed spaced apart from the second common source electrode 215. The common source structures of FIGS. 6 through 10 shows the first and second common source electrodes 211 and 215 that are in contact with each other, similar to the embodiments shown in FIG. 4. However, the common source structures of FIGS. 6 through 10 may be modified to include the first and second common source electrodes 211 and 215 that are separated from each other, similar to the structure shown in FIG. 5.

Figure 6:
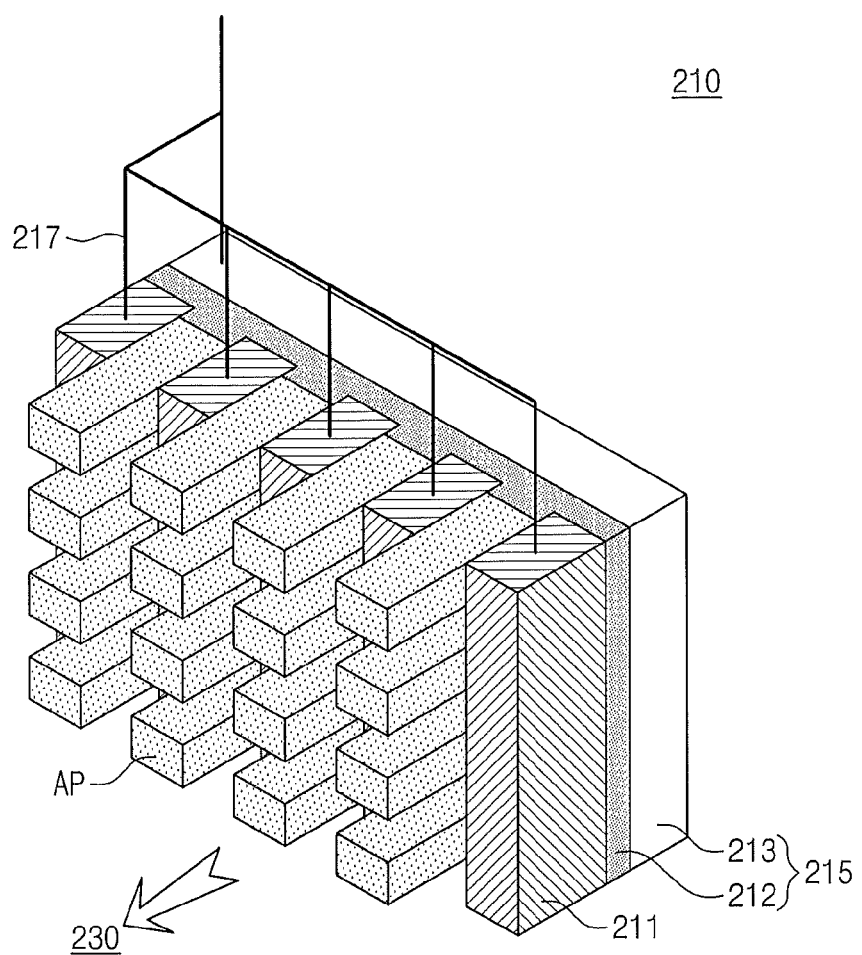
Figure 7:
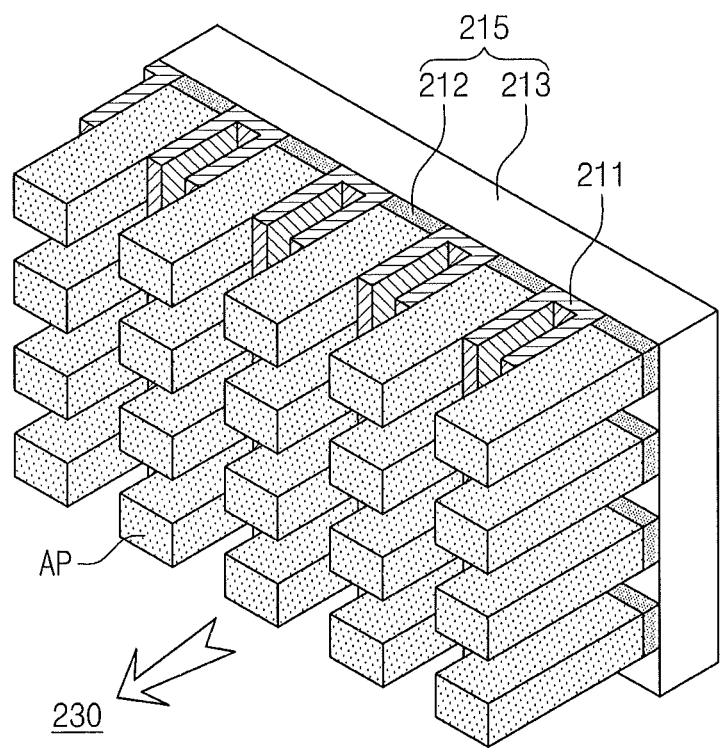

In other modified embodiments, at least one of the first and second common source electrodes 211 and 215 may include at least two layers that are formed of different materials from each other. In other words, at least one of the first and second common source electrodes 211 and 215 may be provided to have a multi-layered structure. For example, as shown in FIGS. 6 and 7, the second common source electrode 215 may include a plate electrode 213 and at least one contact electrode 212 interposed between the plate electrode 213 and the active patterns AP. The contact electrode 212 may be provided to have a plate shape and thereby be connected to all of the active patterns AP, as shown in FIG. 6.

Figure 8:
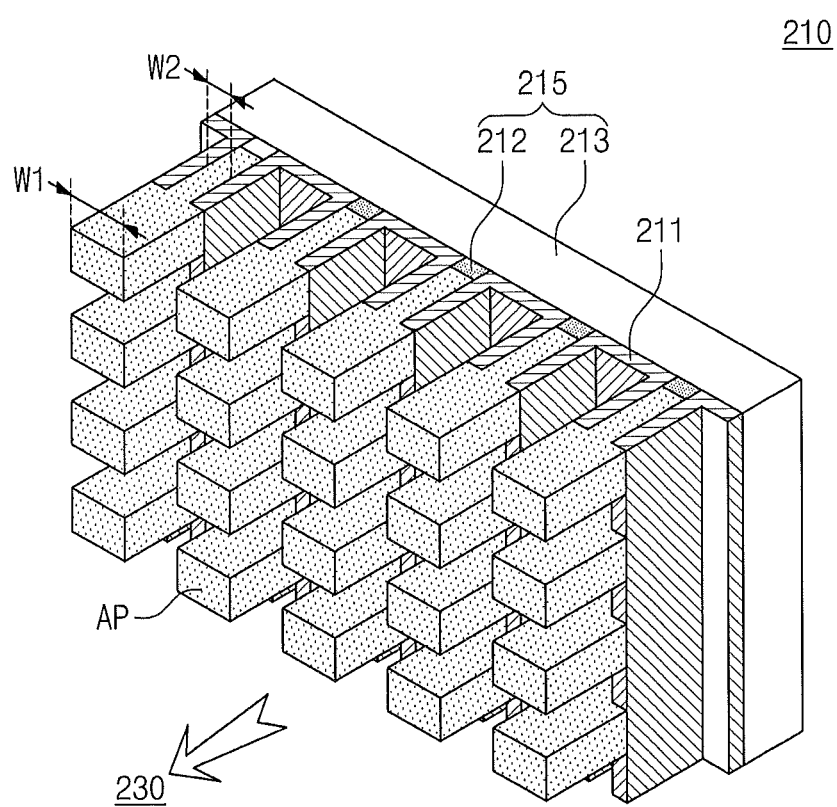

Alternatively, the contact electrode 212 may include a plurality of portions that are separated from each other by the first common source electrode 211 and are connected to each or some of the active patterns AP, as shown in FIG. 7 or FIG. 8. For example, the second common source electrode 215 may include a plurality of contact electrodes 212 that are arranged one- or two-dimensionally on a sidewall of the plate electrode 213. According to the present embodiments, the first common source electrode 211 may be directly connected to the plate electrode 213. In other words, the plate electrode 213 may be connected, in common, to the first common source electrode 211 and the contact electrodes 212.

In the case where the first and second common source electrodes 211 and 215 are provided as the multi-layered structure, a layer spaced apart from the active patterns AP (e.g., the plate electrode 213) may be formed of a material, whose resistivity is lower than other layer adjacent to the active patterns AP (e.g., the contact electrode 212). For example, the layer spaced apart from the active patterns AP may include at least one of metals, metal silicides, or metal nitrides, and the layer adjacent to the active patterns AP may be formed of a semiconductor material.

Meanwhile, the first common source electrode 211 may include source plugs interposed between the active patterns AP and elongated along a vertical direction. The source plugs may be provided to be in contact with the inner sidewalls of the active patterns AP. In example embodiments, each of the source plugs may be formed to have a horizontal section shaped like a rectangle, a circle, or an ellipse. In other embodiments, as shown in FIGS. 7 and 8, each of the source plugs may include junction portions covering a pair of the inner sidewalls of the active patterns AP provided at both sides thereof and a connecting portion facing the second common source electrode 215 and connecting the junction portions to each other. In other words, each of the source plugs may be formed to have a 'U'-shaped horizontal section.

Figure 9:
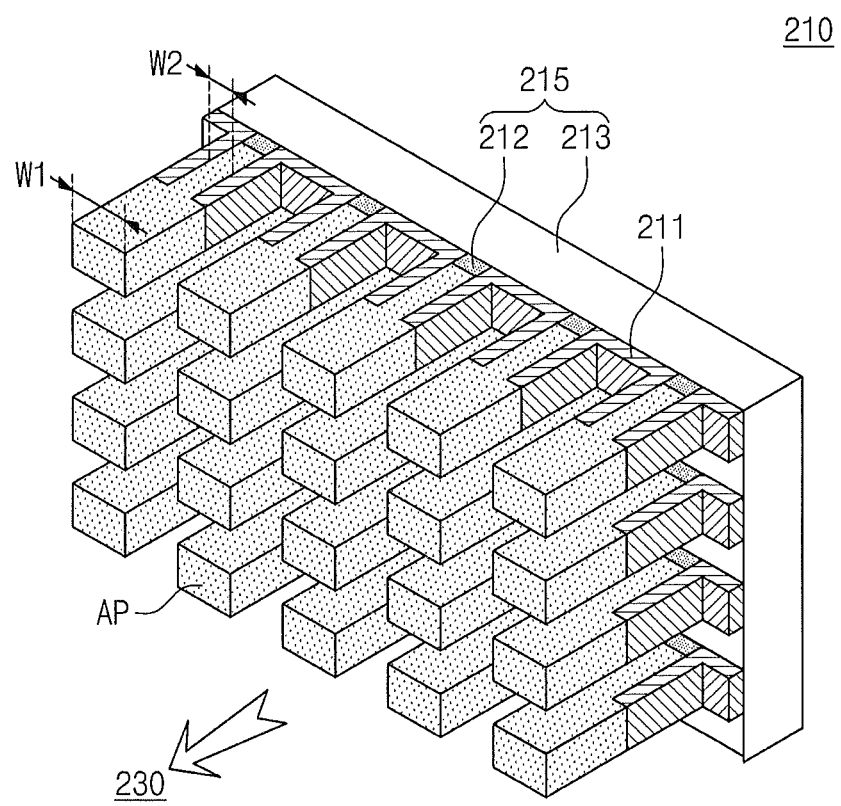

In modified embodiments, the source plugs of the first common source electrode 211 may be formed in such a way that a space W2 therebetween is smaller than a width W1 of each of the active patterns AP. For example, end-portions of the active patterns AP may have a reduced width at portions adjacent to the common source structure 210. Furthermore, as shown in FIG. 9, the source plugs may be vertically separated from each other to form a two-dimensional arrangement on a sidewall of the plate electrode 213. In example embodiments, the source plugs vertically separated from each other may be formed, in a self-aligned manner, by doping the active patterns AP with impurities.

Figure 10:
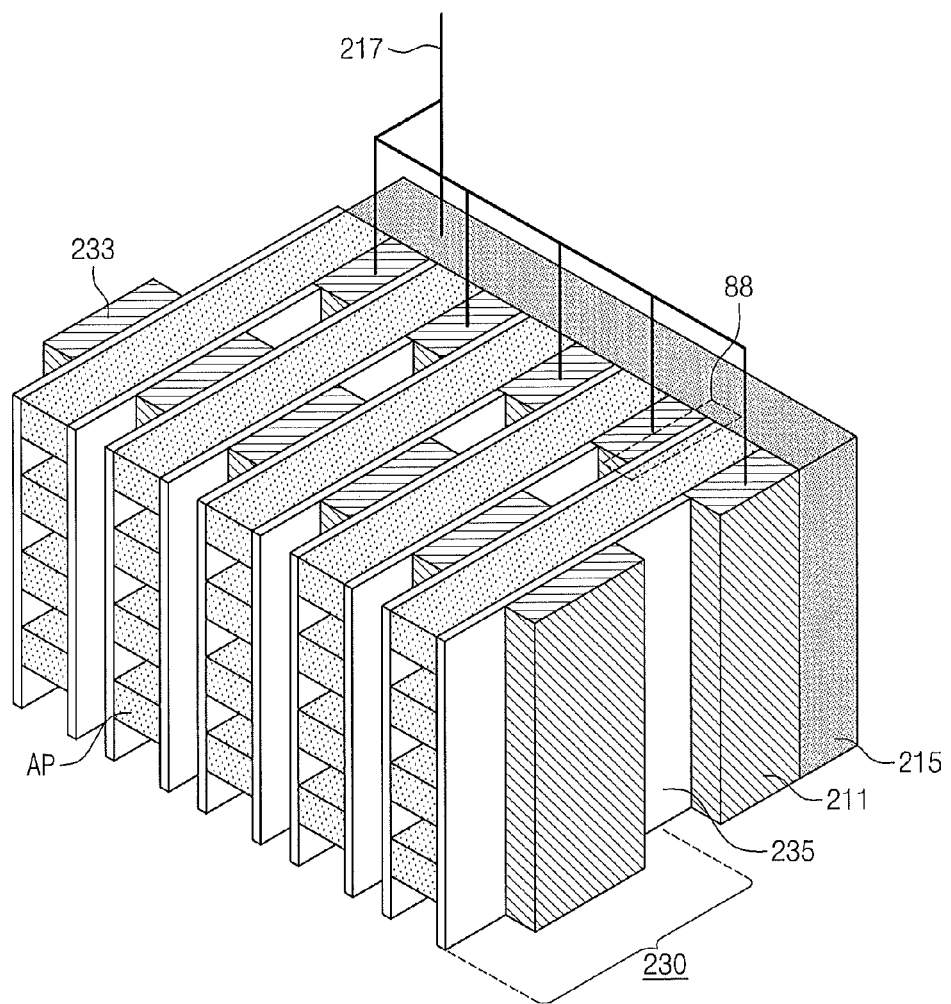

In other modified embodiments, each of the source plugs of the first common source electrode 211 may be connected to some of the active patterns AP located at one side thereof, while it may be electrically separated from the others located at the other side. For example, as shown in FIG. 10, an insulating layer 88 may be provided on one side surface of each of the source plugs to separate the source plugs electrically from some of the active patterns AP. In example embodiments, the memory patterns 235 of the memory structure 230 may be extended into the common source structure 210 and be used as the insulating layer 88.

Figure 11:
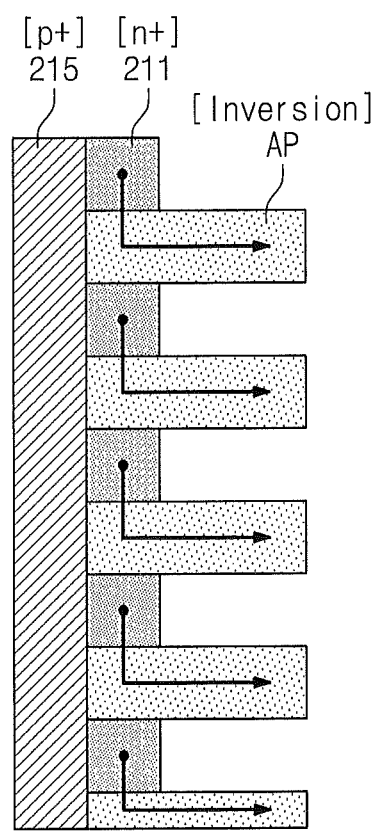
FIGS. 11 and 12 are diagrams illustrating operations of reading and erasing a three-dimensional semiconductor device, according to example embodiments of the inventive concepts.
Figure 12:
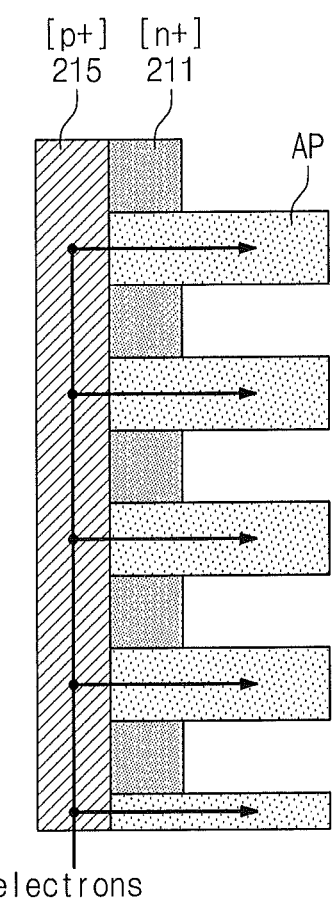

FIGS. 11 and 12 are diagrams illustrating operations of reading and erasing a three-dimensional semiconductor device, according to example embodiments of the inventive concepts. In detail, horizontal sections of the common source structure 210 described with reference to FIG. 4 are shown in FIGS. 11 and 12. The operations may be applied to a three-dimensional NAND FLASH memory device according to example embodiments of the inventive concepts.

Referring to FIG. 11, a read operation of NAND FLASH memory device may include a step of measuring a read current. The read current may be flowed along the active pattern AP between the bit and source lines, and a magnitude of the read current may be determined by a data state of a memory cell located between the bit line and the source electrode. In other words, during the read operation, a current path for the read current may be formed on at least one of the active patterns AP, between the common source structure 210 and the string selection structure 220.

One of the first and second common source electrodes 211 and 215 may serve as an electric path for such a read current. For example, in the case where the active pattern AP is a p-type semiconductor material, an inversion layer may be formed at an end-portion of the active pattern AP, during the read operation. Accordingly, as shown in FIG. 11, if the first common source electrode 211 is n-type, it may be electrically connected to the inversion layer of the active pattern AP.

Referring to FIG. 12, an erase operation of NAND FLASH memory device may include a step of injecting electrons into the active patterns AP. For example, the erase operation may include applying a positive voltage to one of the first and second common source electrodes 211 and 215. The first common source electrode 211 and the active pattern AP may constitute a diode that prevents the positive voltage from being transmitted through the first common source electrode 211, if the first common source electrode 211 and the active pattern AP are n-type and p-type, respectively. However, if the second common source electrode 215 has the same conductivity type as the active pattern AP, this problem can be overcome, as shown in FIG. 12.

Figure 13:
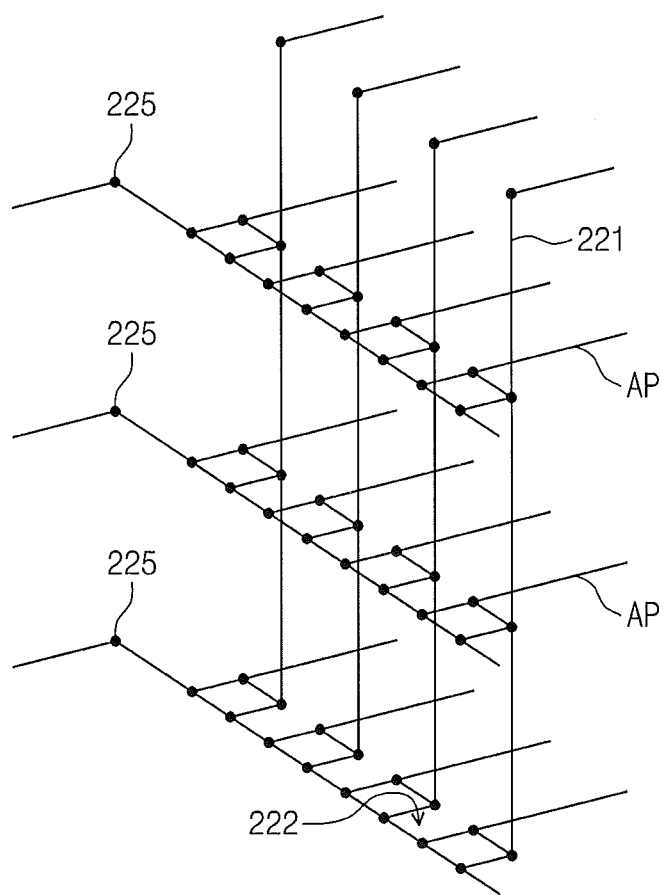
FIG. 13 is a circuit diagram schematically illustrating a string selection structure, according to example embodiments of the inventive concepts.
Figure 14:
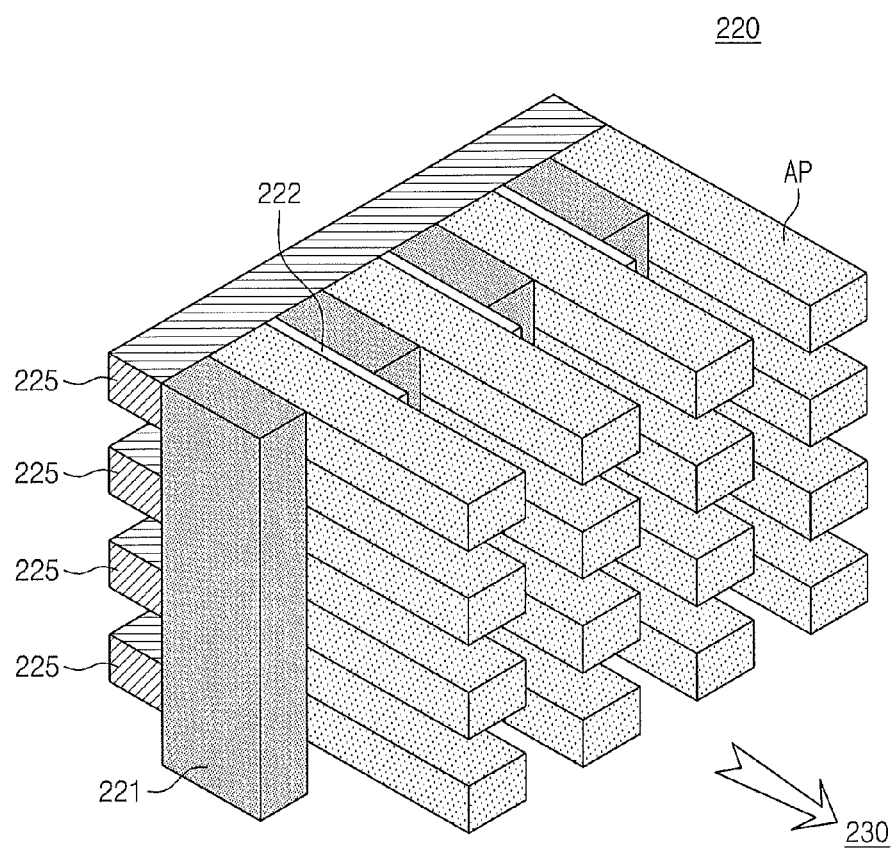
FIGS. 14 and 15 are perspective views illustrating string selection structures, according to example embodiments of the inventive concepts.
Figure 15:
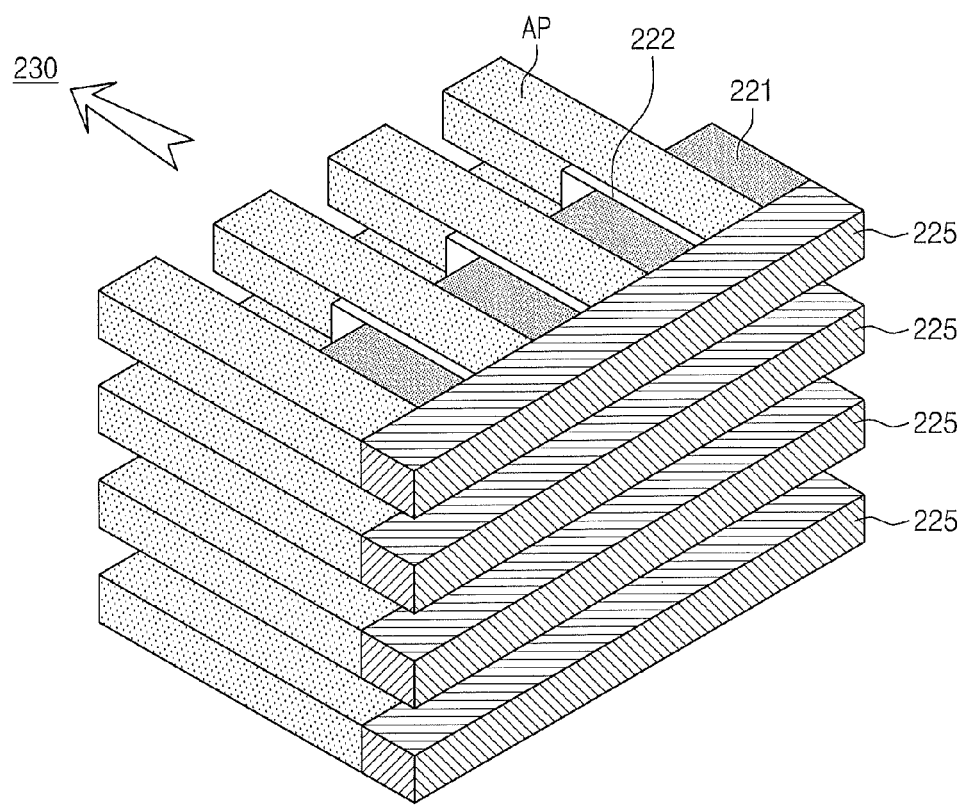

FIG. 13 is a circuit diagram schematically illustrating a string selection structure, according to example embodiments of the inventive concepts. FIGS. 14 and 15 are perspective views illustrating string selection structures, according to example embodiments of the inventive concepts. FIGS. 14 and 15 are perspective views of the identical string structure that are shown at different viewpoints.

Referring to FIGS. 13 through 15, the string selection structure 220 may include drain patterns 221, which are elongated along a vertical direction, and layer-selection patterns 225, which are elongated along a horizontal direction. Each of the drain patterns 221 may be provided between the active patterns AP to connect end-portions of the active patterns AP vertically to each other. However, each of the drain patterns 221 may include a portion located outside the active structure consisting of the active patterns AP. Each of the layer-selection patterns 225 may be provided outside the active structure to connect horizontally the end-portions of the active patterns AP positioned at the same level to each other. In certain embodiments, each of the layer-selection patterns 225 may include a portion located within the active structure.

Each of the drain patterns 221 may be electrically connected to one of the columns of the active patterns AP and be electrically separated from the others. In other words, each of the columns of the active patterns AP may be selectively connected to a corresponding one of the drain patterns 221. In example embodiments, to achieve this selective connection, the string selection structure 220 may further include an insulating spacer 222 that is locally provided on one side of each of the drain patterns 221. The local formation of the insulating spacer 222 will be described in more detail with reference to FIGS. 27 through 29.

The drain patterns 221 may include a semiconductor material having the same conductivity type as the end-portions of the active patterns AP in contact therewith. For example, in the case where the active patterns AP include a lightly-doped n-type semiconductor material or an intrinsic semiconductor material, the drain patterns 221 may include a highly-doped n-type semiconductor material. In other words, each of the drain patterns 221 may be formed in such a way that the portion in contact with the active pattern AP has substantially the same energy band structure as the end-portions of the active patterns AP. According to modified embodiments, the active patterns AP may be configured in such a way that the end-portions in contact with the drain patterns 221 have a different conductivity type from the drain patterns 221 and be inverted by a voltage of a string selection line (e.g., 234 of FIGS. 30 through 23) adjacent thereto to have the same energy band structure as the drain patterns 221.

The layer-selection patterns 225 may be electrically separated from each other by interlayered insulating layers that are sequentially stacked and are interposed therebetween. In other words, each of the layer-selection patterns 225 may be electrically connected to one of the layers of the active patterns AP and be electrically separated from the others.

The layer-selection patterns 225 may be formed of a material capable of forming a depletion layer in the end-portions of the active patterns AP, in a specific operation step. For example, the layer-selection patterns 225 may include a semiconductor material, whose conductivity type is different from the end-portions of the active patterns AP in contact therewith. Accordingly, the layer-selection patterns 225 and the active patterns AP may constitute pn junctions, and in the case where a reverse bias is applied to the layer-selection patterns 225, the depletion layer may be formed at the end-portions of the active patterns AP that are adjacent to the layer-selection patterns 225.

Figure 16:
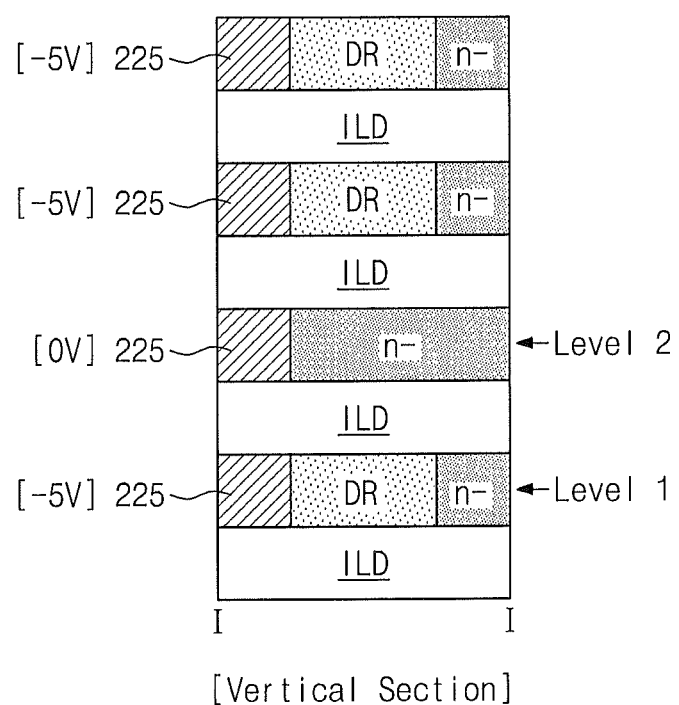
FIGS. 16 through 18 are diagrams provided to describe a method of operating a three-dimensional semiconductor device, for which the string selection structure of FIGS. 14 and 15 is used.
Figure 17:
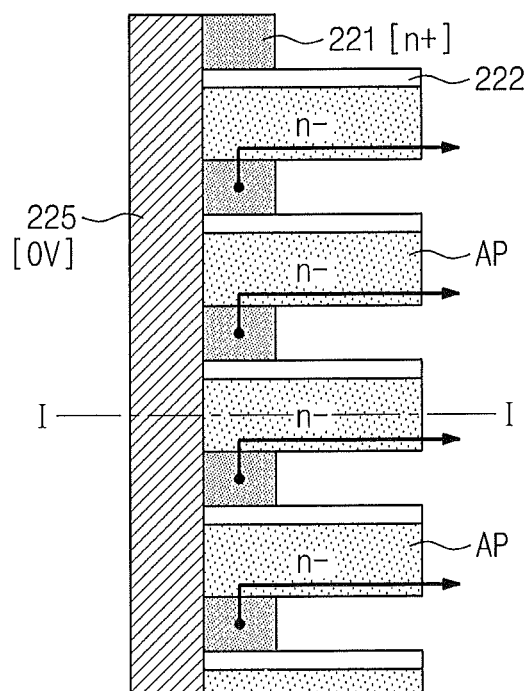
Figure 18:
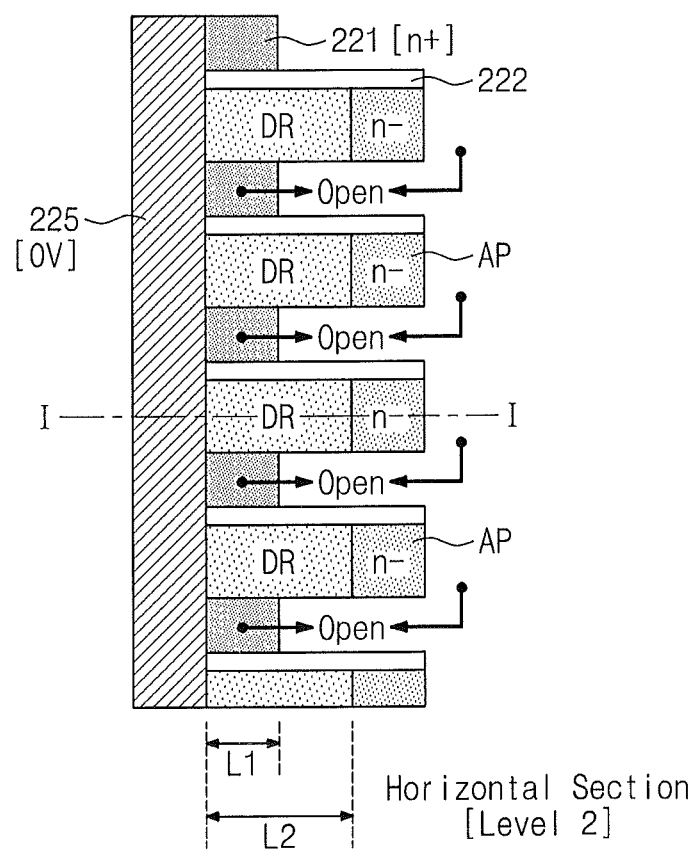

FIGS. 16 through 18 are diagrams provided to describe a method of operating a three-dimensional semiconductor device, for which the string selection structure of FIGS. 14 and 15 is used. In detail, FIG. 16 is a vertical sectional view of the string selection structure of FIGS. 14 and 15, and FIGS. 17 and 18 are horizontal sectional views taken along the first and second levels of FIG. 16. The operations may be applied to a three-dimensional NAND FLASH memory device according to example embodiments of the inventive concepts. Hereinafter, the description that follows will refer to an example embodiment in which the layer-selection patterns 225 are a p-type semiconductor and the active patterns AP and the drain patterns 221 are an n-type semiconductor.

Referring to FIG. 16, a negative voltage (e.g., of −5V) may be applied to the others of the layer-selection patterns 225 that are located at the other levels, except for the second level. In this case, since the layer-selection patterns 225 and the active patterns AP constitute pn junctions as described above, such a voltage condition makes it possible to form a depletion region DR in the end-portions of the active patterns AP. As shown in FIG. 18, a voltage applied to the layer-selection pattern 225 may be selected in such a way that a width L2 of the depletion region DR is greater than a width L1 of the drain patterns 221. Due to the presence of the depletion region DR, the drain patterns 221 can be prevented from being electrically connected to other portions of the active patterns AP.

By contrast, as shown in FIG. 17, a voltage of 0V may be applied to the layer-selection pattern 225 positioned at the second level. Accordingly, the drain patterns 221 may be electrically connected to the active patterns AP. In other words, voltages applied to the drain patterns 221 may be transmitted to ones of the active patterns AP that are located at the second level. In the case where the drain patterns 221 are separated from each other, this means that it is possible to apply different voltages to ones of the active patterns AP located at the second level.

Since the layer-selection patterns 225 may have a different conductivity type from the drain patterns 221, they may constitute pn junctions. This means that the depletion region may be formed in the drain patterns 221 by a voltage applied to the layer-selection pattern 225. However, as described above, in the case where the drain patterns 221 have an impurity concentration that is higher than that of the active patterns AP, it is possible to prevent the depletion region from being excessively expanded in the drain patterns 221.

Figure 19:
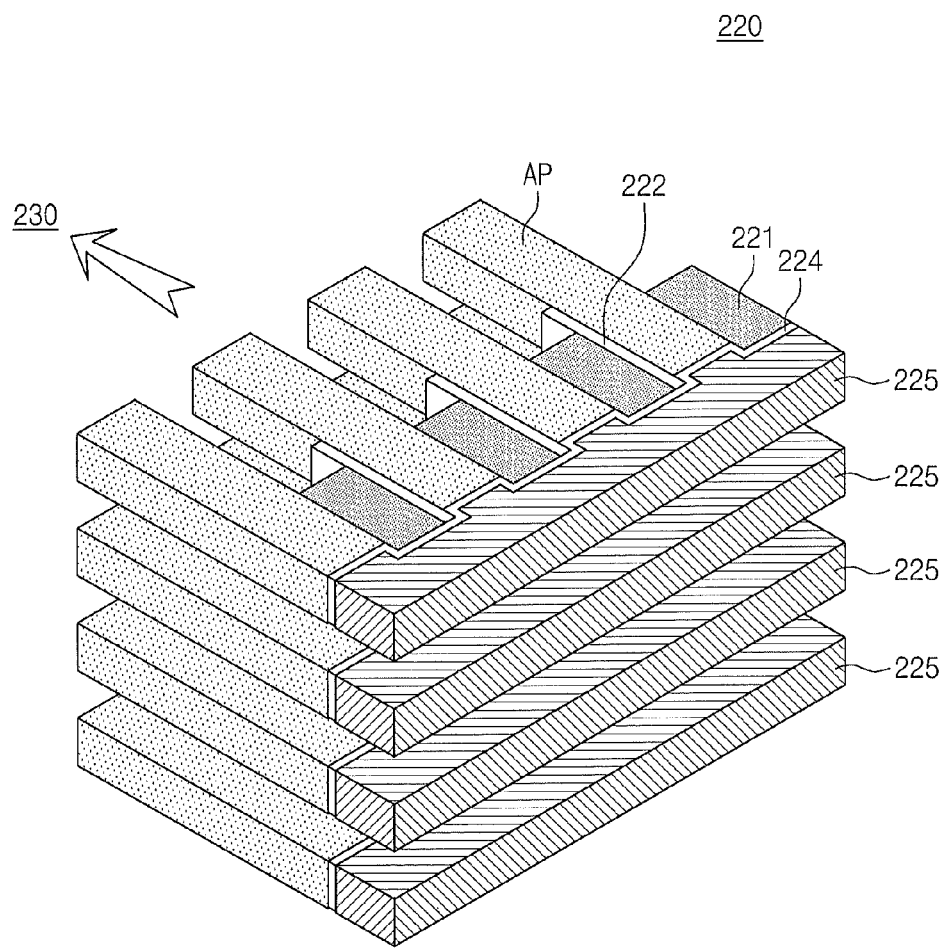
FIGS. 19 and 20 are perspective views illustrating other examples of string selection structures according to example embodiments of the inventive concepts.
Figure 20:
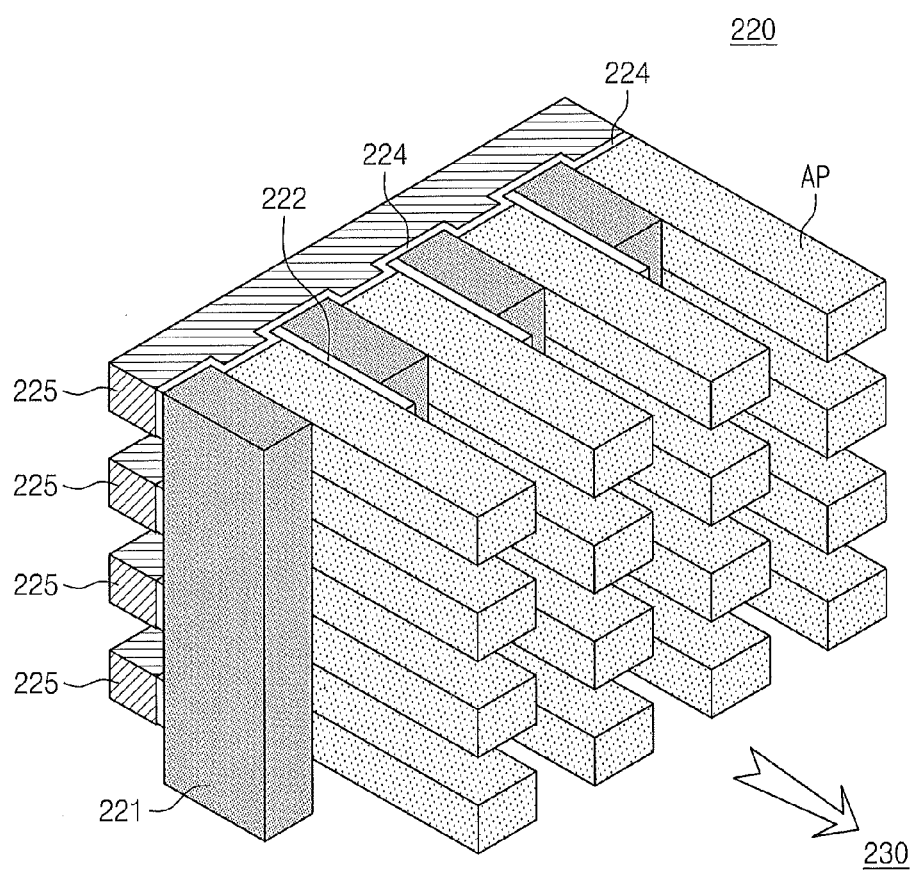
Figure 21:
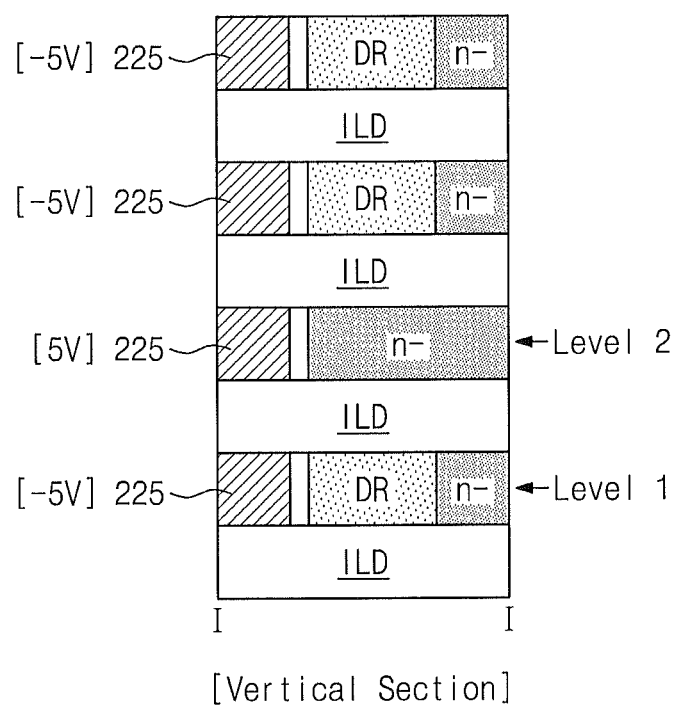
FIGS. 21 through 23 are diagrams provided to describe a method of operating a three-dimensional semiconductor device, for which the string selection structure of FIGS. 19 and 20 is used.
Figure 22:
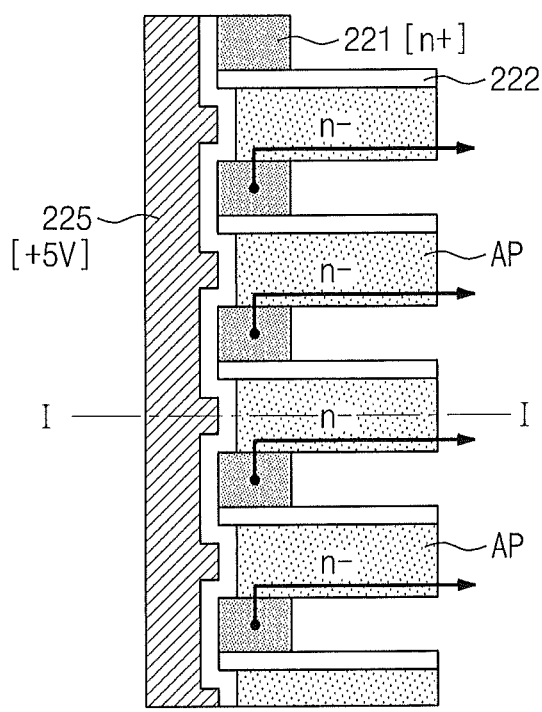
Figure 23:
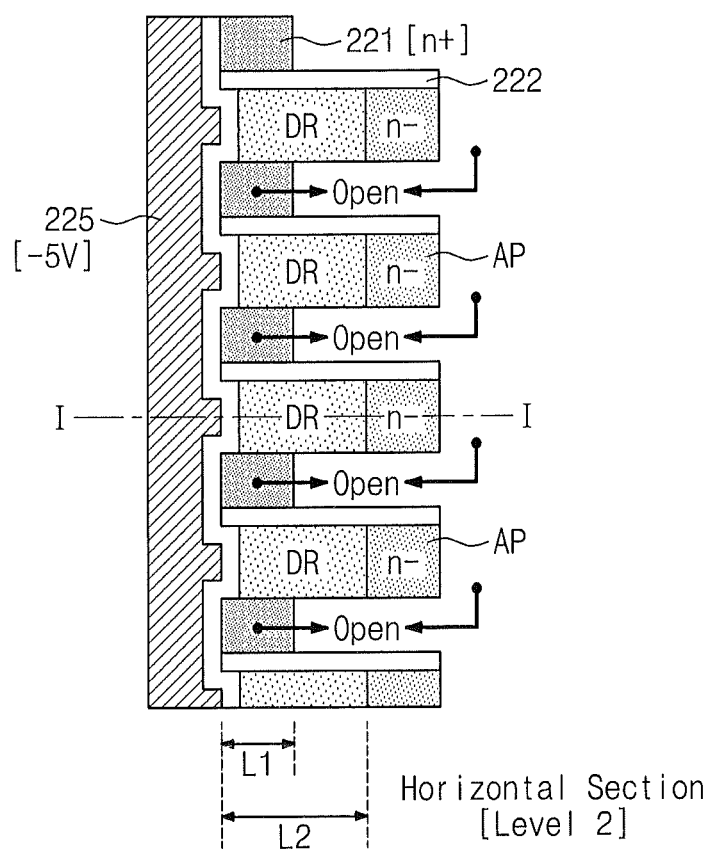

FIGS. 19 and 20 are perspective views illustrating other examples of string selection structures according to example embodiments of the inventive concepts. FIGS. 19 and 20 are perspective views of the identical string structure that are shown at different viewpoints. FIGS. 21 through 23 are diagrams provided to describe a method of operating a three-dimensional semiconductor device, for which the string selection structure of FIGS. 19 and 20 is used. In detail, FIG. 21 shows a vertical sectional of the string selection structure of FIGS. 19 and 20, and FIGS. 22 and 23 show horizontal sections taken at levels 1 and 2, respectively, of FIG. 21. For the sake of brevity, the elements and features of this example that are similar to those previously shown and described with reference to FIGS. 14 through 18 will not be described in much further detail.

Referring to FIGS. 19 and 20, the layer-selection patterns 225 may be electrically separated from the active patterns AP by a string selection insulating layer 224. Accordingly, each of the layer-selection patterns 225 and the active patterns AP adjacent thereto may constitute metal-oxide-semiconductor (MOS) capacitors. According to the present embodiment, the layer-selection patterns 225 may be formed of a semiconductor material, whose conductivity type is equal to or different from that of the active patterns AP, or a metallic material.

Referring to FIGS. 21 through 23, a negative voltage (e.g., of −5V) may be applied to the others of the layer-selection patterns 225 that are located at the other levels, except for the second level. In this case, since the layer-selection patterns 225 and the active patterns AP constitute metal-oxide-semiconductor (MOS) capacitors as described above, such a voltage condition makes it possible to form the depletion region DR in the end-portions of the active patterns AP. As shown in FIG. 23, a voltage applied to the layer-selection pattern 225 may be selected in such a way that the width L2 of the depletion region DR is greater than the width L1 of the drain patterns 221. Due to the presence of the depletion region DR, the drain patterns 221 can be prevented from being electrically connected to other portions of the active patterns AP.

By contrast, as shown in FIG. 22, a ground or positive voltage (e.g., of 0V or 5V) may be applied to the layer-selection pattern 225 positioned at the second level. In this case, a short depletion region or an accumulation region (not shown) may be formed in the end-portions of the active patterns AP, the drain patterns 221 may be electrically connected to the active patterns AP. In other words, voltages of the drain patterns 221 may be transmitted to ones of the active patterns AP that are located at the second level. In the case where the drain patterns 221 are separated from each other, this means that it is possible to apply different voltages to ones of the active patterns AP located at the second level.

Figure 24:
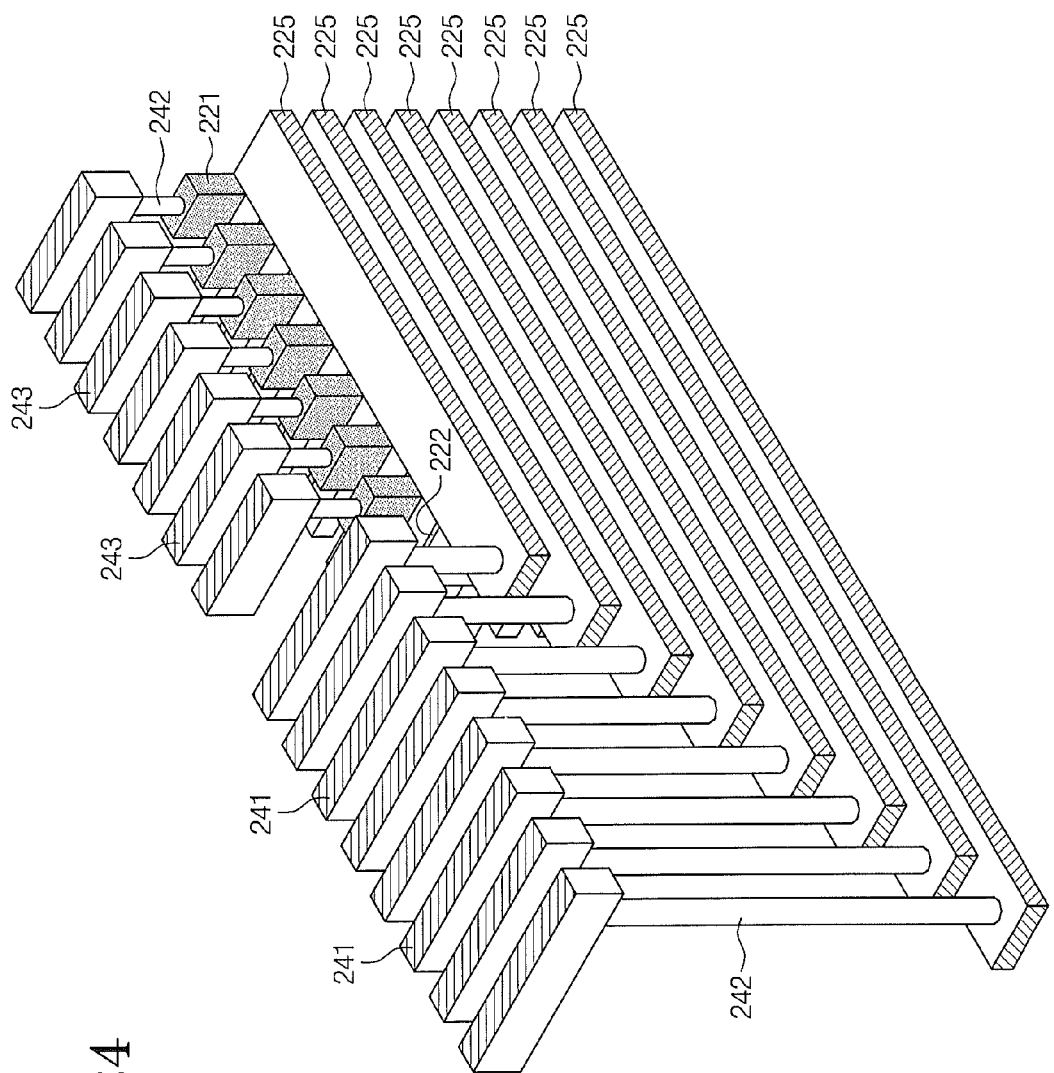
FIGS. 24 through 26 are perspective views illustrating string selection structures according to example embodiments of the inventive concepts.
Figure 25:
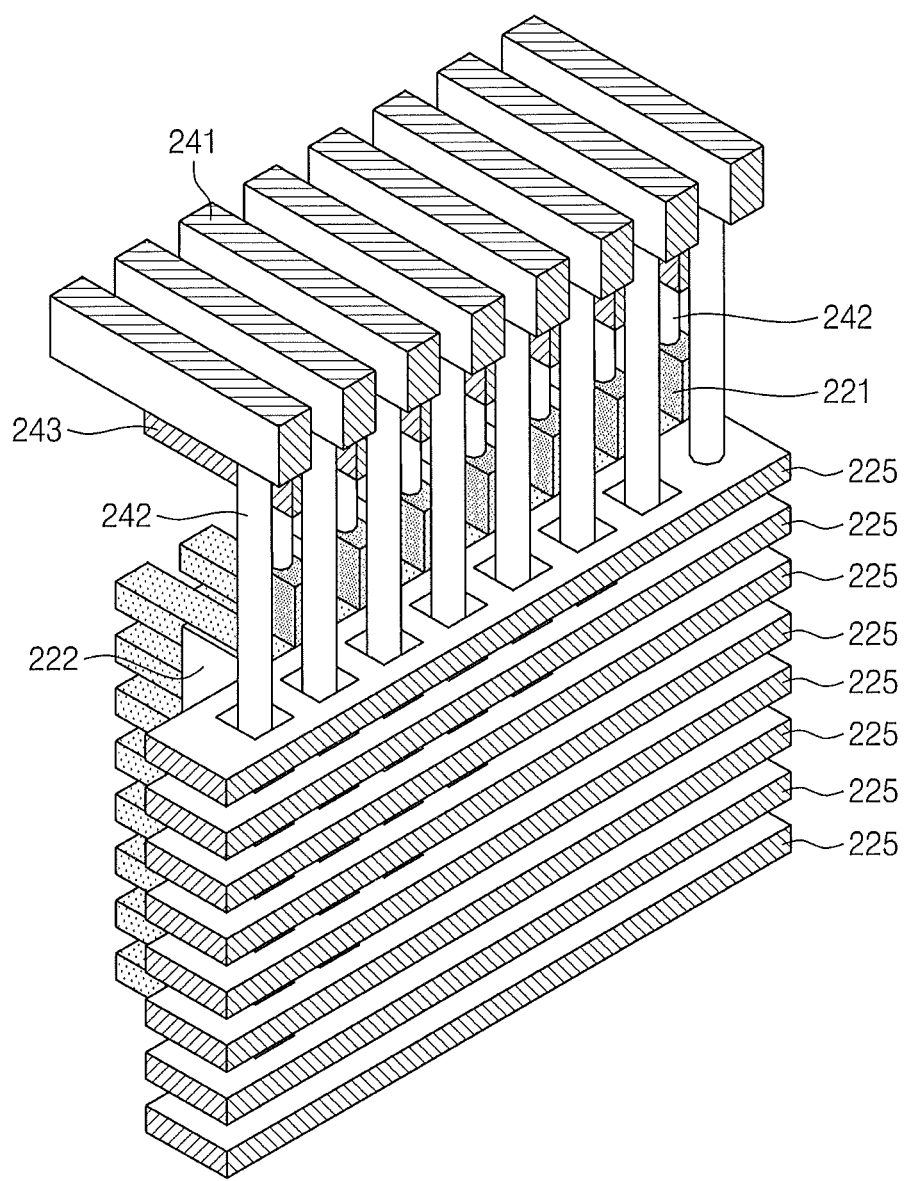
Figure 26:
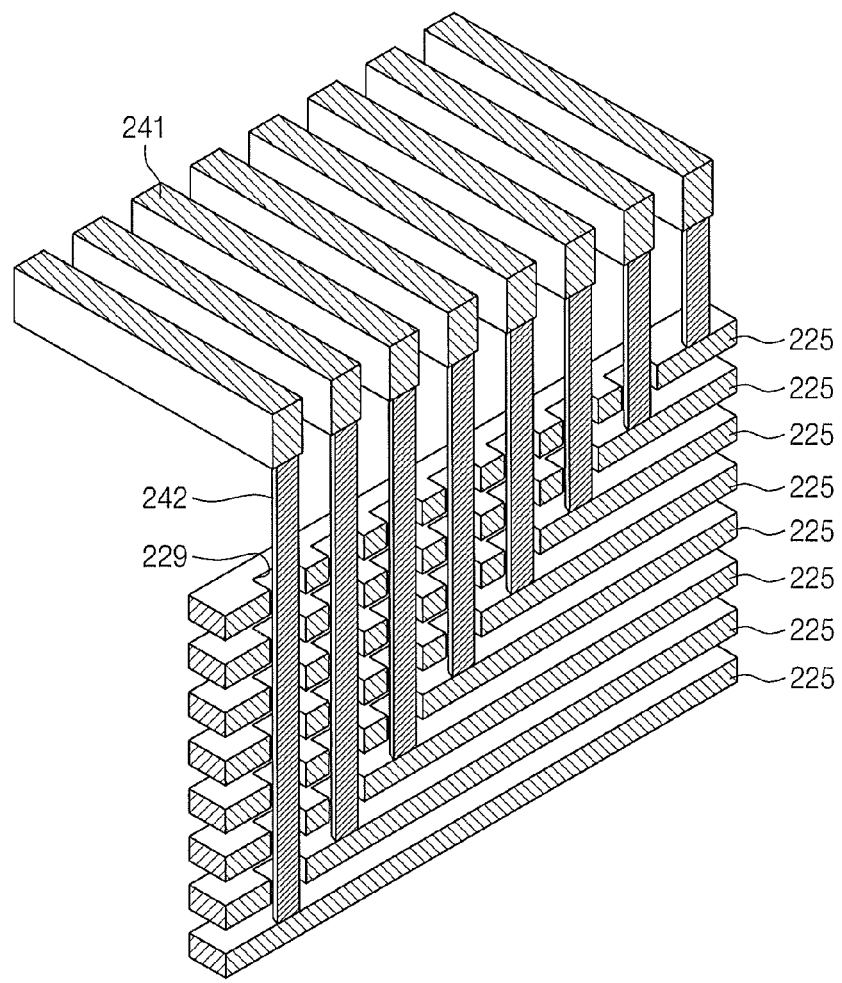

FIGS. 24 through 26 are perspective views illustrating string selection structures according to example embodiments of the inventive concepts. For the sake of brevity, the elements and features of this example that are similar to those previously shown and described will not be described in much further detail.

Referring to FIGS. 24 and 25, the drain patterns 221 may be connected to bit lines 243 through plugs 242, and the layer-selection patterns 225 may be electrically connected to layer-selection lines 241 through the plugs 242. The bit lines 243 may be formed to be substantially parallel to the active patterns AP. The layer-selection lines 241 may be substantially parallel to the active patterns AP or include portions that are substantially parallel to the active patterns AP.

The plugs 242 connected to the drain patterns 221 may be formed to have substantially the same vertical length. By contrast, the plugs 242 connected to the layer-selection patterns 225 may be formed to have vertical lengths different from each other. For example, as shown in FIG. 24, the layer-selection patterns 225 may be formed to have horizontal lengths that are different from each other, and thus, the layer-selection patterns 225 may form a stepwise shaped structure. In this case, the plugs 242 may be connected to the stepwise regions of the layer-selection patterns 225, respectively. As shown in FIGS. 25 and 26, the layer-selection patterns 225 may have substantially the same horizontal length, but they may be formed to have contact holes 229, whose depths are different from each other. Since the contact holes 229 have depths different from each other, the plugs 242 may be connected to the layer-selection patterns 225 at levels different from each other.

Figure 27:
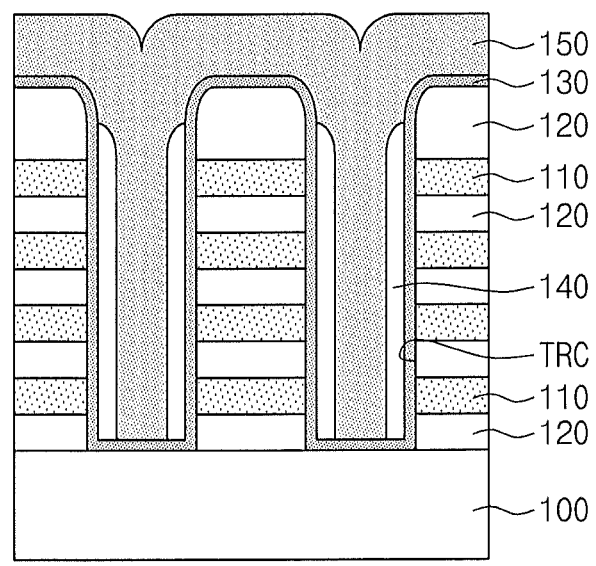
FIGS. 27 through 29 are sectional views illustrating a method of forming an insulating spacer, according to example embodiments of the inventive concepts.
Figure 28:
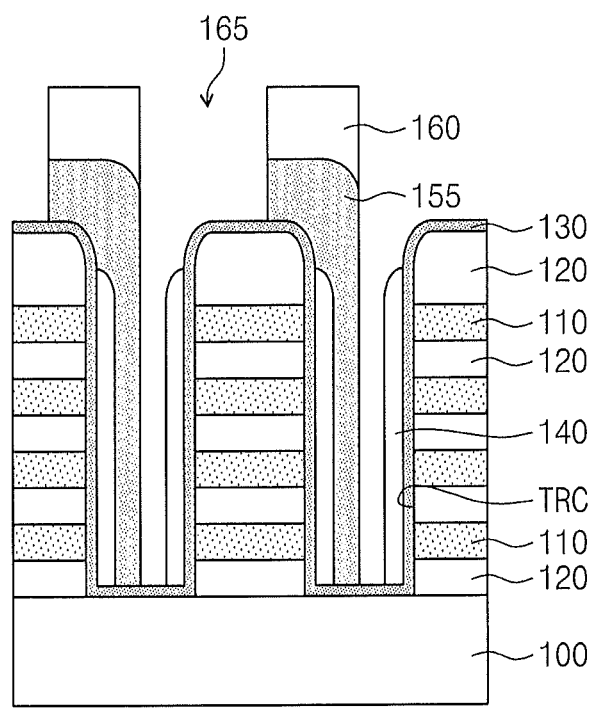
Figure 29:
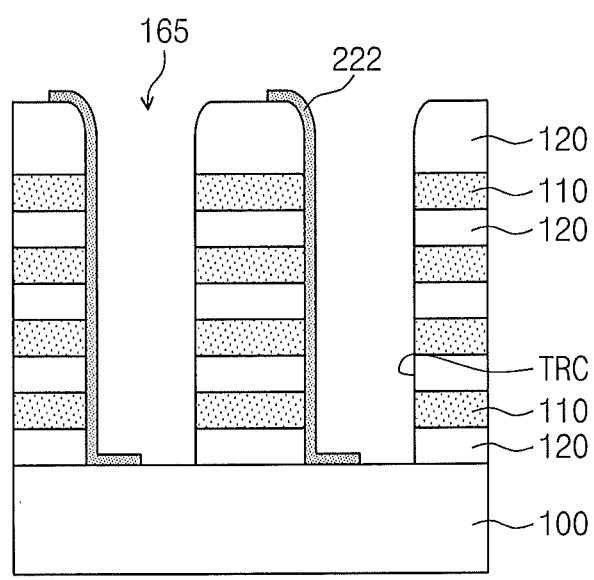

FIGS. 27 through 29 are sectional views illustrating a method of forming the insulating spacer 222, according to example embodiments of the inventive concepts.

Referring to FIG. 27, first layers 110 and second layers 120 may be alternatingly deposited to form a stack on the substrate 100. Trenches TRC may be formed to cross the stack, and then, an insulating spacer layer 130 may be formed on the resulting structure. Mask spacers 140 may be formed on sidewalls of the trenches TRC provided with the insulating spacer layer 130, and then, an insulating gapfill layer 150 may be formed to cover the resulting structure.

In example embodiments, the first layers 110 may be formed of a semiconductor material, thereby serving as the active patterns AP. The second layers 120 may be formed of an insulating layer (e.g., of silicon oxide), thereby serving as interlayered dielectric layers that separate the active patterns AP vertically from each other. The insulating spacer layer 130 may be formed of at least one of a silicon oxide layer or a silicon nitride layer. The mask spacers 140 may include a silicon oxide layer or a silicon nitride layer, and be formed of, for example, a material having an etch selectivity with respect to the insulating spacer layer 130. The insulating gapfill layer 150 may be formed of at least one of materials capable of filling the trenches TRC provided with the mask spacers 140 and having an etch selectivity with respect to the insulating spacer layer 130. For example, the insulating gapfill layer 150 may include an amorphous carbon layer.

Referring to FIG. 28, a mask pattern 160 may be formed on the resulting structure with the insulating gapfill layer 150, and the insulating gapfill layer 150 may be etched using this as an etch mask, thereby forming insulating gapfill patterns 155. The etching step may be performed to cover one of the mask spacers 140, which are expected by the trenches TRC, respectively, and expose the other of the mask spacers 140.

Referring to FIG. 29, the exposed ones of the mask spacers 140 and a portion of the insulating spacer layer 130 disposed therebelow may be removed by an etching process, in which the mask pattern 160 or the insulating gapfill patterns 155 are used as an etch mask. Thereafter, the mask pattern 160, the insulating gapfill patterns 155, and the mask spacers 140 may be removed. Accordingly, as shown, the insulating spacer 222 may be formed to cover a sidewall of each of the trenches TRC. In example embodiments, the mask pattern 160 and the insulating gapfill patterns 155 may be removed before the formation of the spacer 222.

A process of forming the spacer 222 is described with reference to FIGS. 27 through 29, but example embodiments of the inventive concepts may not be limited thereto. For example, the formation of the spacer 222 described with reference to FIGS. 27 through 29 may be variously and easily modified by a skilled person.

Figure 30:
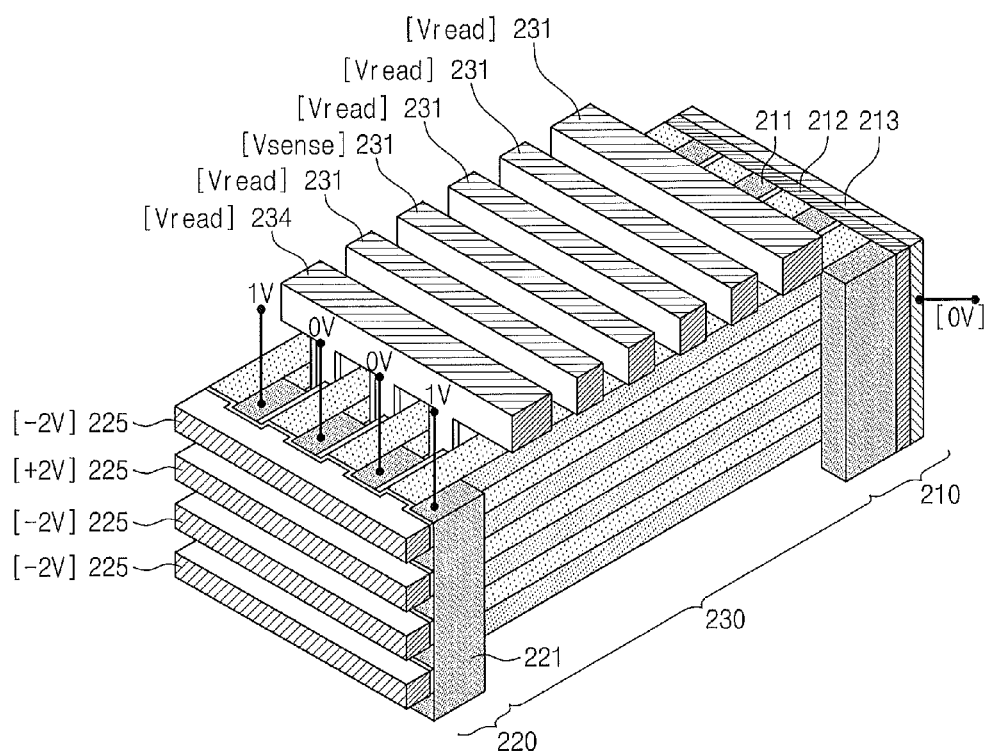
FIGS. 30 through 32 are diagrams provided to describe operations of reading, programming, and erasing a three-dimensional semiconductor device, according to example embodiments of the inventive concepts.
Figure 31:
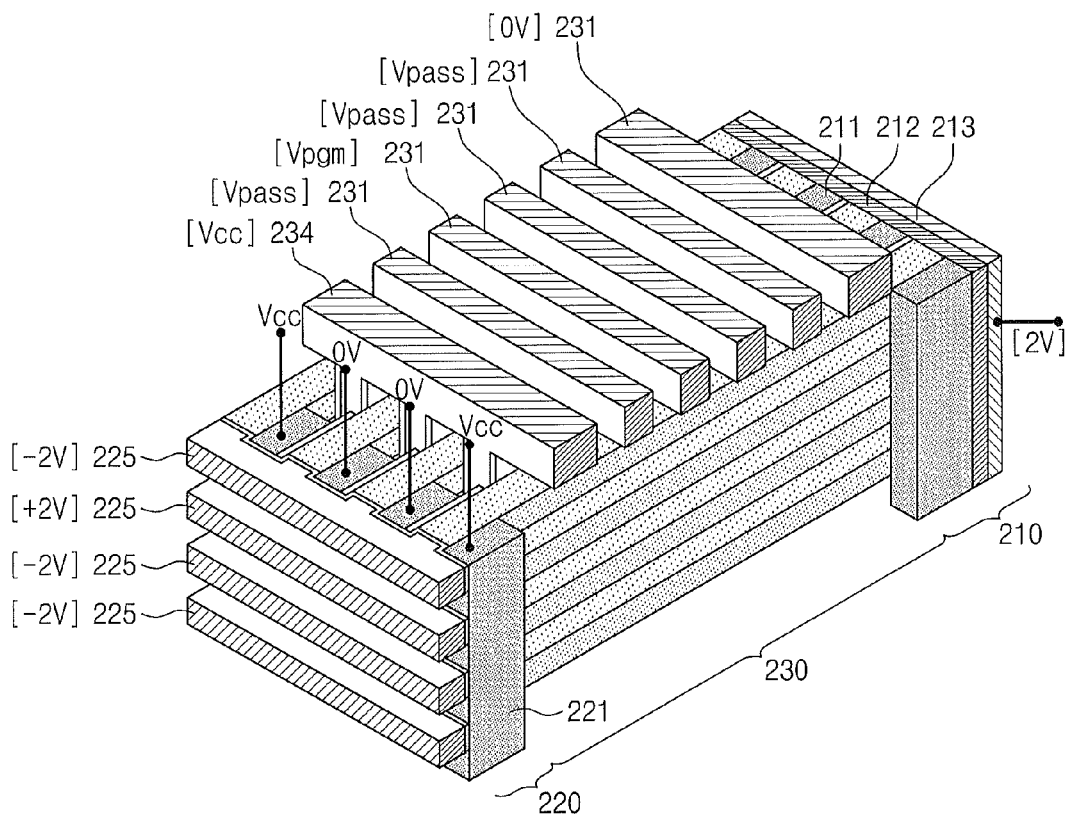
Figure 32:
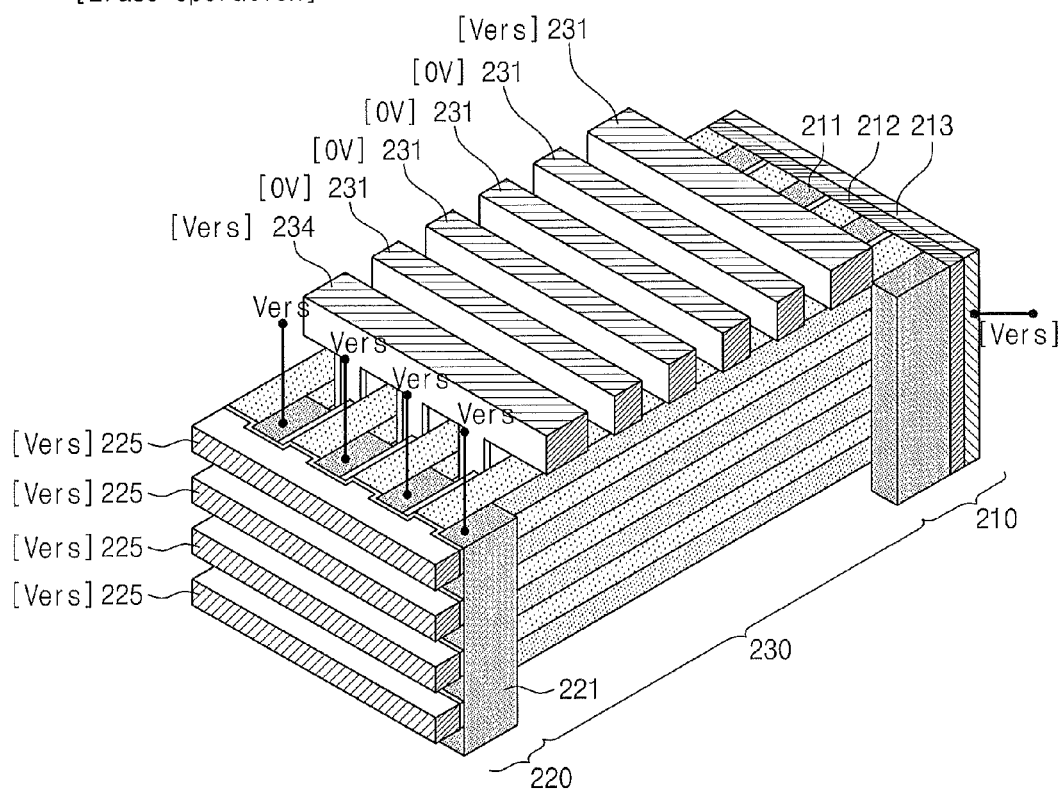

FIGS. 30 through 32 are diagrams provided to describe operations of reading, programming, and erasing a three-dimensional semiconductor device, according to example embodiments of the inventive concepts.

Referring to FIG. 30, a read operation may be performed using the operation methods of a string selection structure described with reference to FIGS. 21 through 23 and of a common source structure described with reference to FIG. 11. In this case, current paths between the drain patterns 221 and the common source structure 210 may be formed through the active patterns AP that are located at a selected level. In this case, the read operation may be performed, in units of a page, by selecting one of the word lines 231.

Referring to FIG. 31, a programming operation may be performed using the operation method of a string selection structure described with reference to FIGS. 21 through 23. In this case, some of the active patterns AP, at a specific level, may be electrically connected to the drain patterns 221, depending on a condition of voltages applied to the string selection line 234 and the drain patterns 221. In example embodiments, the programming operation may be performed using a self-boosting method.

Referring to FIG. 32, an erase operation may be performed using the operation method of a common source structure described with reference to FIG. 12. In this case, holes may be directly injected from the common source structures 211, 212, and 213 into the active patterns AP. In example embodiments, as shown, the holes may be injected through the string selection structure.

Figure 33:
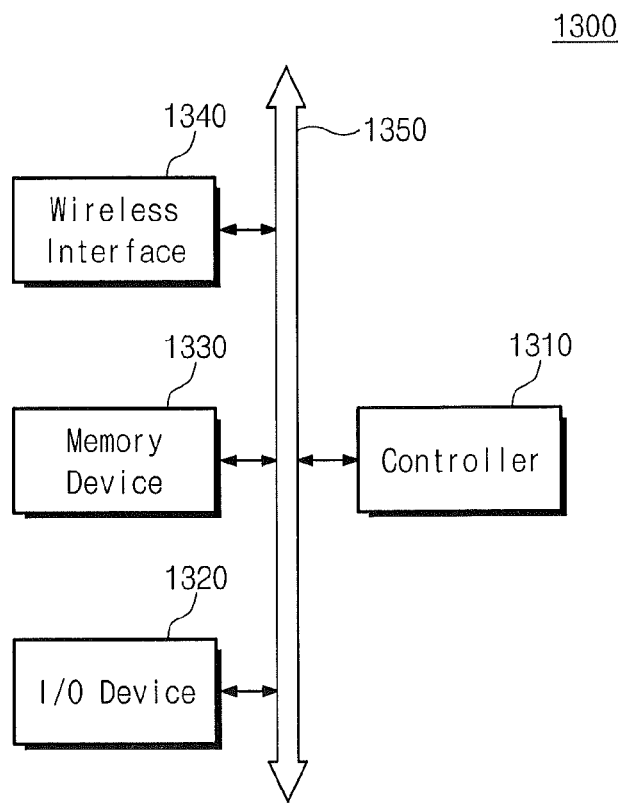
FIGS. 33 and 34 are block diagrams schematically illustrating electronic devices including a semiconductor device according to example embodiments of inventive concepts.
Figure 34:
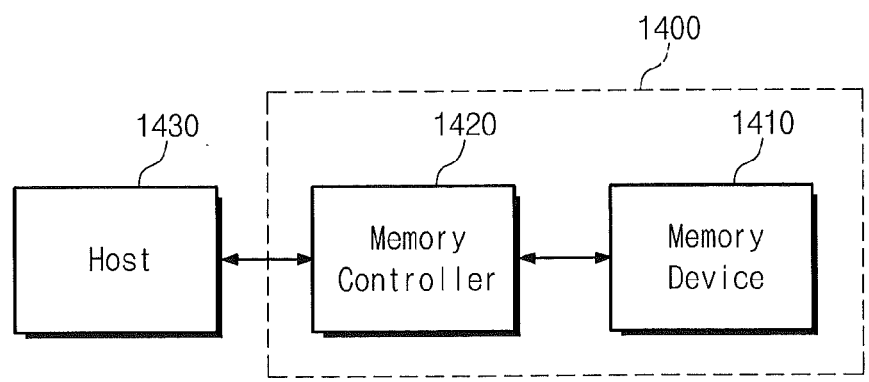

FIGS. 33 and 34 are block diagrams schematically illustrating electronic devices including a semiconductor device according to example embodiments of inventive concepts.

Referring to FIG. 33, an electronic device 1300 including a semiconductor device according to example embodiments of inventive concepts may be used in one of a personal digital assistant (PDA), a laptop computer, a mobile computer, a web tablet, a wireless phone, a cell phone, a digital music player, a wire or wireless electronic device, or a complex electronic device including at least two ones thereof. The electronic device 1300 may include a controller 1310, an input/output device 1320 such as a keypad, a keyboard, a display, a memory 1330, and a wireless interface 1340 that are combined to each other through a bus 1350. The controller 1310 may include, for example, at least one microprocessor, a digital signal process, a microcontroller or the like. The memory 1330 may be configured to store a command code to be used by the controller 1310 or a user data. The memory 1330 may include a semiconductor device according to example embodiments of inventive concepts. The electronic device 1300 may use a wireless interface 1340 configured to transmit data to or receive data from a wireless communication network using a RF signal. The wireless interface 1340 may include, for example, an antenna, a wireless transceiver and so on. The electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Referring to FIG. 34, a memory system including a semiconductor device according to example embodiments of inventive concepts will be described. The memory system 1400 may include a memory device 1410 for storing huge amounts of data and a memory controller 1420. The memory controller 1420 controls the memory device 1410 so as to read data stored in the memory device 1410 or to write data into the memory device 1410 in response to a read/write request of a host 1430. The memory controller 1420 may include an address mapping table for mapping an address provided from the host 1430 (e.g., a mobile device or a computer system) into a physical address of the memory device 1410. The memory device 1410 may be a semiconductor device according to example embodiments of inventive concepts.

The semiconductor memory devices disclosed above may be encapsulated using various and diverse packaging techniques. For example, the semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a system in package (SIP) technique, a multi-chip package (MCP) technique, a wafer-level fabricated package (WFP) technique and a wafer-level processed stack package (WSP) technique.

The package in which a semiconductor memory device according to example embodiments may be mounted may further include at least one semiconductor device (e.g., a controller and/or a logic device) that is configured to control the semiconductor memory device.

According to example embodiments of the inventive concepts, active patterns may be connected to a common source electrode including n-type and p-type semiconductor patterns. Accordingly, during read and erase operations, the active patterns may be electrically connected to the common source electrode.

According to example embodiments of the inventive concepts, active patterns positioned at the same level may be connected in common to one of layer-selection patterns. The layer-selection patterns may be configured to control a width of a depletion layer, which may be formed in the active patterns and thereby control electric connections between bit lines and the active patterns.

While example embodiments of the inventive concepts have been particularly shown and described, it will be understood by one of ordinary skill in the art that variations in form and detail may be made therein without departing from the spirit and scope of the attached claims.

What is claimed is:

1. A three-dimensional semiconductor memory device, comprising:
a common source structure, a string selection structure, and a memory structure on a substrate, the memory structure interposed between the common source structure and the string selection structure,
wherein the memory structure comprises a plurality of sequentially stacked active patterns elongated parallel to a top surface of the substrate and including first and second end-portions, gate patterns extending perpendicular to the top surface of the substrate, and memory elements interposed between the active patterns and the gate patterns, and
wherein the string selection structure comprises:
drain patterns elongated perpendicular to the top surface of the substrate to connect the first end-portions of the active patterns to each other; and
layer-selection patterns sequentially stacked to control an energy band structure of respective ones of the first end-portions of the sequentially stacked active patterns located at a same level.

2. The device of claim 1, wherein the drain patterns comprise a semiconductor material in direct contact with sidewalls of the first end-portions of the active patterns and having the same conductivity type as the active patterns.

3. The device of claim 2, wherein the drain patterns comprise an n- or p-type highly-doped semiconductor material, and
the active patterns comprise a lightly-doped semiconductor material having the same conductivity type as the drain patterns.

4. The device of claim 1, wherein the layer-selection patterns comprise a semiconductor material in direct contact with end walls of the first end-portions of the active patterns and having a different conductivity type from the active patterns.

5. The device of claim 4, wherein the drain patterns comprise a semiconductor material being in direct contact with sidewalls of the first end-portions of the active patterns having a different conductivity type from the active patterns, and
the drain patterns have an impurity concentration higher than the first end-portions of the active patterns.

6. The device of claim 1, wherein the string selection structure further comprises a string selection insulating layer electrically insulating sidewalls and end walls of the first end-portions of the active patterns from the layer-selection patterns.

7. The device of claim 6, wherein each of the layer-selection patterns and first end-portions of the active patterns located adjacent thereto are configured as metal-oxide-semiconductor (MOS) capacitors.

8. The device of claim 1, wherein the active patterns are arranged in horizontal and vertical directions to have a multi-layered and multi-column structure, and
a respective one of the drain patterns is provided between a corresponding pair of columns of the active patterns.

9. The device of claim 8, wherein a respective one of the drain patterns is connected in common to a plurality of the first end-portions of the active patterns that constitute a corresponding one of the columns and are arranged at different levels from each other.

10. The device of claim 8, wherein a respective one of the layer-selection patterns is connected in common to a plurality of the first end-portions of the active patterns that constitute a corresponding one of the layers and are arranged at different columns from each other.

11. The device of claim 1, wherein the drain patterns are connected to sidewalls of the first end-portions of the active patterns, and wherein the layer-selection patterns are connected to end walls of the first end-portions of the active patterns.

12. The device of claim 11 wherein the drain patterns are directly connected to the sidewalls of the first end-portions of the active patterns.

13. The device of claim 12 wherein the layer-selection patterns are directly connected to the end walls of the first end-portions of the active patterns.

14. The device claim 12 further comprising a string selection insulating layer on the end walls of the first end-portions of the active patterns, wherein the layer-selection patterns are on the string selection insulating layer opposite the end walls of the first end-portions of the active patterns.

15. A three-dimensional semiconductor memory device, comprising:
a first layer comprising first and second active patterns;
a second layer comprising third and fourth active patterns;
wherein the first through fourth active patterns each include first and second end-portions;
a first drain pattern connected to the first and third active patterns at the first end-portions thereof;
a second drain pattern connected to the second and fourth active patterns at the first end-portions thereof;
a first layer-selection pattern connected to the first and second active patterns at the first end-portions thereof and configured to control depths of depletion regions in the first and second active patterns; and
a second layer-selection pattern connected to the third and fourth active patterns at the first end-portions thereof and configured to control depths of depletion regions in the third and fourth active patterns.

16. The device of claim 15, wherein the first drain patterns comprise a semiconductor material in direct contact with sidewalls of the first end-portions of the first and third active patterns and having a same conductivity type as the first end-portions of the first and third active patterns, and
the second drain patterns comprises a semiconductor material in direct contact with sidewalls of the first end-portions of the second and fourth active patterns and having a same conductivity type as the first end-portions of the second and fourth active patterns.

17. The device of claim 15, wherein the first and second drain patterns comprise an n- or p-type semiconductor material, and
the first end-portions of the first to fourth active patterns comprise a semiconductor material having the same conductivity type as the first and second drain patterns.

18. The device of claim 15, wherein the first layer-selection pattern comprises a semiconductor material in direct contact with end walls of the first end-portions of the first and second active patterns and having a different conductivity type from the first end-portions of the first and second active patterns.

19. The device of claim 18, wherein the first drain patterns comprise a semiconductor material in direct contact with sidewalls of the first end-portions of the first and third active patterns and having a same conductivity type as the first end-portions of the first and third active patterns,
the second drain patterns comprise a semiconductor material in direct contact with sidewalls of the first end-portions of the second and fourth active patterns and having a same conductivity type as the first end-portions of the second and fourth active patterns, and each of the first and second drain patterns have an impurity concentration higher than the first end-portions of the first to fourth active patterns.

20. A three-dimensional semiconductor memory device, comprising:
   a common source structure, a string selection structure, and a memory structure on a substrate, the memory structure interposed between the common source structure and the string selection structure,
   wherein the memory structure comprises a plurality of sequentially stacked active patterns elongated parallel to a top surface of the substrate and including first and second end-portions, gate patterns extending perpendicular to the top surface of the substrate, and memory elements interposed between the active patterns and the gate patterns,
   wherein the string selection structure is configured to select a plurality of the memory elements at a given level relative to the top surface of the substrate, while simultaneously refraining from selecting other memory elements that overlie or underlie the plurality of memory elements at the given level, and
   wherein the string selection structure comprises:
      drain patterns elongated perpendicular to the top surface of the substrate to connect the first end-portions of the active patterns to each other; and
      layer-selection patterns sequentially stacked on the substrate adjacent the first end-portions.

21. The device of claim 20, wherein the active patterns are arranged in horizontal and vertical directions to have a multi-layered and multi-column structure, and
   each of the drain patterns is provided between a corresponding pair of columns of the active patterns.

22. The device of claim 21, wherein each of the drain patterns is connected in common to a plurality of sidewalls of the active patterns that constitute a corresponding one of the columns and are arranged at different levels from each other.

23. A three-dimensional semiconductor memory device, comprising:
   a common source structure, a string selection structure, and a memory structure on a substrate, the memory structure interposed between the common source structure and the string selection structure,
   wherein the memory structure comprises a plurality of sequentially stacked active patterns elongated parallel to a top surface of the substrate and including first and second end-portions, gate patterns extending perpendicular to the top surface of the substrate, and memory elements interposed between the active patterns and the gate patterns, and
   wherein the string selection structure comprises:
      drain patterns elongated perpendicular to the top surface of the substrate to connect sidewalls of the first end-portions of the active patterns to each other; and
      layer-selection patterns sequentially stacked and connected to end walls of the first end-portions located at a same level to control an energy band structure of respective ones of the first end-portions of the sequentially stacked active patterns located at the same level.

24. The device of claim 23 wherein the drain patterns are directly connected to the sidewalls of the first end-portions of the active patterns.

25. The device of claim 24 wherein the layer-selection patterns are directly connected to the end walls of the first end-portions of the active patterns.

26. The device claim 24 further comprising a string selection insulating layer on the end walls of the first end-portions of the active patterns, wherein the layer-selection patterns are on the string selection insulating layer opposite the end walls of the first end-portions of the active patterns.

* * * * *